(12) United States Patent
Choi et al.

(10) Patent No.: US 11,003,414 B2
(45) Date of Patent: May 11, 2021

(54) ACOUSTIC CONTROL SYSTEM, APPARATUS AND METHOD

(71) Applicant: LG ELECTRONICS INC., Seoul (KR)

(72) Inventors: Hyeon Sik Choi, Incheon (KR); Jae Pil Seo, Seoul (KR); Keun Sang Lee, Seoul (KR)

(73) Assignee: LG Electronics Inc., Seoul (KR)

( * ) Notice: Subject to any disclaimer, the term of this patent is extended or adjusted under 35 U.S.C. 154(b) by 0 days.

(21) Appl. No.: 16/601,979

(22) Filed: Oct. 15, 2019

(65) Prior Publication Data

US 2020/0042285 A1    Feb. 6, 2020

(30) Foreign Application Priority Data

Aug. 30, 2019    (KR) .................. 10-2019-0107470

(51) Int. Cl.
| | | |
|---|---|---|
| *G10L 15/16* | (2006.01) | |
| *G10L 15/22* | (2006.01) | |
| *G06F 3/16* | (2006.01) | |
| *H03G 5/16* | (2006.01) | |
| *G06N 3/02* | (2006.01) | |

(Continued)

(52) U.S. Cl.
CPC .............. *G06F 3/165* (2013.01); *G06N 3/04* (2013.01); *G06N 3/08* (2013.01); *G10L 15/063* (2013.01); *G10L 15/16* (2013.01); *G10L 15/22* (2013.01); *G10L 25/84* (2013.01); *H03G 5/165* (2013.01);

(Continued)

(58) Field of Classification Search
CPC . H04R 3/00; H04R 3/005; H04R 3/04; H04R 2499/13; H04R 29/00; H04R 29/001; G06F 3/165; G10L 15/06; G10L 15/063; G10L 15/16; G10L 15/18; G10L 15/22; G10L 21/02; G10L 25/30; G10L 25/84; H03G 5/165; H03G 2201/103; G06N 3/02; G06N 3/04; G06N 3/08; G06N 3/0454

See application file for complete search history.

(56) References Cited

U.S. PATENT DOCUMENTS

| | | | | |
|---|---|---|---|---|
| 2010/0040242 A1* | 2/2010 | Yamaguchi | ............. | H03G 3/32 381/86 |
| 2012/0130580 A1* | 5/2012 | Omote | ................. | G10K 15/02 701/22 |

(Continued)

FOREIGN PATENT DOCUMENTS

| | | | | |
|---|---|---|---|---|
| JP | 2000022470 | A | * | 1/2000 |
| JP | 2002232247 | A | * | 8/2002 |

(Continued)

*Primary Examiner* — Thang V Tran
(74) *Attorney, Agent, or Firm* — Fish & Richardson P.C.

(57) ABSTRACT

Disclosed is an acoustic control method for operating an acoustic control system and apparatus by executing artificial intelligence (AI) algorithms and/or machine learning algorithms in a 5G environment connected for Internet of Things. An acoustic control method for adjusting a sound according to an embodiment of the present disclosure may include collecting one or more acoustic signals in a vehicle through at least one microphone provided in the vehicle, analyzing the acoustic signals in the vehicle, and adjusting volume and equalizer settings of an acoustic service being outputted through a speaker provided in the vehicle in response to the analyzed acoustic signals in the vehicle.

16 Claims, 13 Drawing Sheets

(51) Int. Cl.
  *H04R 29/00*  (2006.01)
  *G10L 25/84*  (2013.01)
  *G10L 15/06*  (2013.01)
  *G06N 3/04*   (2006.01)
  *G06N 3/08*   (2006.01)

(52) U.S. Cl.
  CPC ..... *H04R 29/001* (2013.01); *H03G 2201/103* (2013.01); *H04R 2499/13* (2013.01)

(56) References Cited

U.S. PATENT DOCUMENTS

| | | |
|---|---|---|
| 2017/0026764 A1* | 1/2017 | Rajendran ................ H03G 3/32 |
| 2017/0043713 A1* | 2/2017 | Sun .......................... B60Q 5/00 |
| 2017/0123754 A1* | 5/2017 | Kwon .................... G10K 15/02 |

FOREIGN PATENT DOCUMENTS

| | | |
|---|---|---|
| KR | 101437432 | 9/2014 |
| KR | 1020160050135 | 5/2016 |

* cited by examiner

ACOUSTIC CONTROL SYSTEM, APPARATUS AND METHOD

CROSS-REFERENCE TO RELATED APPLICATION

This application claims benefit of priority to Korean Patent Application No. 10-2019-0107470, filed on Aug. 30, 2019, the entire disclosure of which is incorporated herein by reference.

BACKGROUND

1. Technical Field

The present disclosure relates to an acoustic control system, apparatus, and method, and more particularly, to an acoustic control system, apparatus, and method for estimating the amount of noise in a vehicle so as to enable adaptive volume and equalizer adjustment of sounds outputted in the vehicle.

2. Description of Related Art

Recently, due to the development of autonomous vehicles, agent services such as voice assistants are increasing in vehicles, and many studies are being conducted on improving sound quality in vehicles. Accordingly, an in-vehicle speaker includes, for example, a volume control system or an equalizer control system for each seat for various sound field effects.

Related art 1 discloses a technology relating to a method for allowing passengers to communicate without being disturbed by the output of an audio device by automatically lowering the volume of the audio device when two or more passengers in a vehicle are detected to be talking to each other.

Related art 2 discloses a technology relating to a method for supporting optimum sound according to the state of a vehicle based on information on the inside and outside of the vehicle obtained from a vehicle information collection device connected to a network system based on optical communication.

That is, related art 1 and related art 2 can adjust the volume according to an event occurring in a vehicle, or adjust the sound differently for each speaker position. However, according to related art 1 and related art 2, a single set value is maintained even if the volume or equalizer is adjusted differently for each seat (speaker), so that the effect of improving the sound quality that the user feels in response to the change of the event occurring in the vehicle is significantly reduced. In addition, according to related art 1 and related art 2, it may be difficult for a user to hear feedback of a voice secretary due to noise that changes according to the driving environment, such as high-speed driving or window opening, or it may be difficult to obtain clear hearing when listening to music or talking on the phone.

The above information disclosed in this Background section is provided only for enhancement of understanding of the background of the present disclosure and therefore it may contain information that does not form prior art that is already known in this country to a person of ordinary skill in the art.

RELATED ART DOCUMENTS

Related Art 1: Korean Patent Application Publication No. 10-2016-0050135 (published on May 11, 2016)

Related Art 2: Korean Patent Registration No. 10-1437432 (Registered on Aug. 28, 2014)

SUMMARY OF THE INVENTION

An aspect of the present disclosure is to estimate the magnitude and waveform of noise generated in a vehicle so as to enable adaptive volume and equalizer setting adjustment of sounds outputted in the vehicle.

Another aspect of the present disclosure is to adjust the volume and equalizer settings of an acoustic service being outputted from a speaker in response to the amount of noise when noise occurs so that the user can listen at a volume set by the user regardless of the amount of background noise.

Still another aspect of the present disclosure is to improve speech recognition performance by removing a spoken response utterance signal corresponding to the speech recognition result among acoustic signals collected through the microphone when using a voice agent service in the vehicle, and adjusting the volume and equalizer setting of the spoken response utterance signal outputted by the speaker according to the magnitude and waveform of the noise.

Yet another aspect of the present disclosure is to adjust volume and equalizer settings of an acoustic service being outputted from a speaker when a user is talking with another passenger in a vehicle, so as to enable a smooth conversation.

Still another aspect of the present disclosure is to improve acoustic event detection performance by analyzing an event pattern for an acoustic signal and applying weight to an acoustic service frequently used by user or a frequently occurring event.

Yet another aspect the present disclosure is to improve user satisfaction by adjusting volume and equalizer settings of a speaker output acoustic service in various ways for each user or event.

Still another aspect of the present disclosure is to adjust the volume and equalizer settings according to the vehicle driving mode so as to provide an acoustic service of clear sound quality under any circumstances.

Yet another aspect of the present disclosure is to analyze an acoustic signal using a deep neural network model trained in advance, and enable adaptive adjustment of the volume and equalizer settings of the acoustic service being outputted in the vehicle according to the analysis result of the acoustic signal, to thereby improve performance and reliability of the acoustic control system.

The present disclosure is not limited to what has been described above, and other aspects not mentioned herein will be apparent from the following description to one of ordinary skill in the art to which the present disclosure pertains. Furthermore, it will be understood that aspects and advantages of the present disclosure may be achieved by the means set forth in claims and combinations thereof.

An acoustic control method for adjusting a sound according to an embodiment of the present disclosure may include adaptively adjusting volume and equalizer settings of an acoustic service being outputted in a vehicle, by estimating the magnitude and waveform of noise collected through a microphone in the vehicle.

In detail, an acoustic control method for adjusting a sound according to an embodiment of the present disclosure may include collecting one or more acoustic signals in a vehicle through at least one microphone provided in the vehicle, analyzing the acoustic signals in the vehicle, and adjusting volume and equalizer settings of an acoustic service being outputted through a speaker provided in the vehicle in response to the analyzed acoustic signals in the vehicle.

Through the acoustic control method according to this embodiment, by adjusting the volume and equalizer settings of an acoustic service being outputted from a speaker in response to the amount of noise when noise occurs, the user can listen at a volume set by the user regardless of the amount of background noise.

Further, the collecting of the acoustic signals in the vehicle may include removing at least one output acoustic signal, inputted to the speaker to be outputted through the speaker, among the acoustic signals in the vehicle.

Through the collecting of the acoustic signals in the vehicle according to this embodiment, by removing a spoken response utterance signal corresponding to the speech recognition result among acoustic signals collected through the microphone when using a voice agent service in the vehicle, and adjusting the volume and equalizer setting of the spoken response utterance signal outputted by the speaker according to the magnitude and waveform of the noise, speech recognition performance can be improved, and a spoken response utterance corresponding to a speech recognition result can be clearly heard by a user.

Further, the analyzing of the acoustic signals in the vehicle may include determining whether the acoustic signals in the vehicle are normal noise or abnormal noise using a first deep neural network model that has been trained in advance to determine whether the acoustic signals are normal noise or abnormal noise generated in the vehicle by analyzing features of the acoustic signals, wherein the first deep neural network model has been trained through training data in which big data on sounds normally generated in a vehicle are labeled as normal noise.

The acoustic control method according an embodiment of the present disclosure may further include, prior to the collecting of the acoustic signals in the vehicle through at least one microphone provided in the vehicle, registering a spoken utterance of a user of the vehicle through the microphone, and training a deep neural network for speech discrimination with the spoken utterance of the user to thereby generate a second deep neural network model capable of discriminating the spoken utterance of the user.

Through the acoustic control method according to this embodiment, by analyzing an acoustic signal using a deep neural network model trained in advance, and enabling adaptive adjustment of the volume and equalizer settings of the acoustic service being outputted in the vehicle according to the analysis result of the acoustic signal, performance and reliability of an acoustic control system can be improved.

Further, the adjusting may include, as a result of analyzing the acoustic signals in the vehicle by using the first and second deep neural network models, when the acoustic signals in the vehicle are normal noise including the spoken utterance of the user, generating a first acoustic event signal; activating a speech recognition service in response to the first acoustic event signal; detecting acoustic signals other than the spoken utterance of the user among the acoustic signals in the vehicle; and adjusting volume and equalizer settings of at least one spoken response utterance signal corresponding to the spoken utterance of the user according to a magnitude and waveform of the noise.

Further, the adjusting may include, as a result of analyzing the acoustic signals in the vehicle by using the first and second deep neural network models, when the acoustic signals in the vehicle are normal noise including the spoken utterance of the user and a spoken utterance of another passenger, generating a second acoustic event; deactivating a speech recognition service in response to the second acoustic event signal; detecting sounds of the spoken utterance of the user and the spoken utterance of the other passenger among the acoustic signals, as noise; and adjusting volume and equalizer settings of the acoustic service in response to the magnitude and waveform of the noise.

Further, the adjusting may include, as a result of analyzing the acoustic signals in the vehicle by using the first and second deep neural network models, when the acoustic signals in the vehicle are normal noise including the spoken utterance of another passenger other than the user, generating a third acoustic event signal; deactivating a speech recognition service in response to the third acoustic event signal; detecting the spoken utterance of the other passenger among the acoustic signals, as noise; and adjusting volume and equalizer settings of the acoustic service in response to the magnitude and waveform of the noise.

Further, the adjusting may include, as a result of analyzing the acoustic signals in the vehicle by using the first deep neural network model, when the acoustic signals in the vehicle are normal noise including the acoustic service, generating a fourth acoustic event signal; deactivating a speech recognition service in response to the fourth acoustic event signal; detecting acoustic signals other than the acoustic service, among the acoustic signals in the vehicle, as noise; and adjusting volume and equalizer settings of the acoustic service in response to the magnitude and waveform of the noise.

Further, the adjusting may include, as a result of analyzing the acoustic signals in the vehicle by using the first deep neural network model, when the acoustic signals in the vehicle are abnormal noise including external environmental noise generated in the vehicle, generating a fifth acoustic event signal; and in response to the fifth acoustic event, adjusting volume and equalizer settings of the acoustic service in response to a magnitude and waveform of the abnormal noise within a predetermined range on the basis of a user setting state.

Through the adjusting according to this embodiment, by adjusting the volume and equalizer settings of the acoustic service being outputted from the speaker in response to the magnitude and waveform of the noise when the user is talking with another user in the vehicle, smooth conversation is possible, and when the user uses a voice agent service and an acoustic service (such as music and a navigation guidance voice) in the vehicle, an output acoustic signal of constant and clear sound quality can be outputted Further, the acoustic control method may further include detecting a driving mode of the vehicle, and the adjusting may include adjusting volume and equalizer settings of the acoustic service in response to the driving mode of the vehicle.

Through the acoustic control method according to this embodiment, by determining an acoustic event reflecting the driving mode of the vehicle, and adjusting the volume and equalizer settings of the acoustic service according to the determined acoustic event, the volume and equalizer settings can be adjusted differently for each user or event, thereby improving user satisfaction.

An acoustic control apparatus configured to adjust a sound according to an embodiment of the present disclosure may include: a collector configured to collect one or more acoustic signals in a vehicle through at least one microphone provided in the vehicle; a determiner configured to analyze the acoustic signals in the vehicle; and an adjuster configured to adjust volume and equalizer settings of an acoustic service being outputted through a speaker provided in the vehicle in response to the analyzed acoustic signals in the vehicle.

Through the acoustic control apparatus according to this embodiment, by estimating the magnitude and waveform of noise generated in a vehicle so as to enable adaptive volume and equalizer setting adjustment of sounds being outputted in the vehicle, the user can listen to a clear acoustic service in any situation, and communication in the vehicle can become smooth, thereby improving user satisfaction toward the acoustic control apparatus.

Further, the collector may be configured to remove at least one output acoustic signal, inputted to the speaker to be outputted through the speaker, among the acoustic signals in the vehicle.

Through the collector according to this embodiment, by removing a spoken response utterance signal corresponding to the speech recognition result among acoustic signals collected through the microphone when an in-vehicle voice agent is used, and adjusting the volume of a spoken response utterance signal outputted by the speaker according to the magnitude and waveform of the noise, speech recognition performance of the acoustic control apparatus can be improved.

Further, the determiner may be configured to determine whether the acoustic signals in the vehicle are normal noise or abnormal noise using a first deep neural network model that has been trained in advance to determine whether the acoustic signals are normal noise or abnormal noise generated in the vehicle by analyzing features of the acoustic signals, wherein the first deep neural network model has been trained through training data in which big data on sounds normally generated in a vehicle are labeled as normal noise.

Further, the acoustic control apparatus may be configured to, prior to collecting one or more acoustic signals in the vehicle through the microphone provided in the vehicle, register a spoken utterance of a user of the vehicle through the microphone and train a deep neural network for speech discrimination with the spoken utterance of the user to thereby generate a second deep neural network model capable of discriminating the spoken utterance of the user.

Through the acoustic control apparatus according to this embodiment, by analyzing an event pattern for an acoustic signal and applying weight to an acoustic service frequently used by a user or a frequently occurring event, acoustic event detection performance of the acoustic control apparatus can be improved.

Further, the adjuster may be configured to, as a result of analyzing the acoustic signals in the vehicle by using the first and second deep neural network models, when the acoustic signals in the vehicle are normal noise including the spoken utterance of the user, generate a first acoustic event signal; activate a speech recognition service in response to the first acoustic event signal; detect acoustic signals other than the spoken utterance of the user among the acoustic signals in the vehicle; and adjust volume and equalizer settings of at least one spoken response utterance signal corresponding to the spoken utterance of the user according to a magnitude and waveform of the noise.

Further, the adjuster may be configured to, as a result of analyzing the acoustic signals in the vehicle by using the first and second deep neural network models, when the acoustic signals in the vehicle are normal noise including the spoken utterance of the user and a spoken utterance of another passenger, generate a second acoustic event signal; deactivate a speech recognition service in response to the second acoustic event signal; detect sounds of the spoken utterance of the user and the spoken utterance of the other passenger among the acoustic signals, as noise; and adjust volume and equalizer settings of the acoustic service in response to the magnitude and waveform of the noise.

Further, the adjuster may be configured to, as a result of analyzing the acoustic signals in the vehicle by using the first and second deep neural network models, when the acoustic signals in the vehicle are normal noise including the spoken utterance of another passenger other than the user, generate a third acoustic event signal; deactivate a speech recognition service in response to the third acoustic event signal; detect the spoken utterance of the other passenger among the acoustic signals, as noise; and adjust volume and equalizer settings of the acoustic service in response to the magnitude and waveform of the noise.

Further, the adjuster may be configured to, as a result of analyzing the acoustic signals in the vehicle by using the first deep neural network model, when the acoustic signals in the vehicle are normal noise including the acoustic service, generate a fourth acoustic event signal; deactivate a speech recognition service in response to the fourth acoustic event signal; detect acoustic signals other than the acoustic service, among the acoustic signals in the vehicle, as noise; and adjust volume and equalizer settings of the acoustic service in response to the magnitude and waveform of the noise.

Through the adjuster according to this embodiment, by adjusting the volume and equalizer settings in various ways for each user or event, the user's needs can be satisfied, and the user's satisfaction can be improved.

Further, the adjuster may be configured to, as a result of analyzing the acoustic signals in the vehicle by using the first deep neural network model, when the acoustic signals in the vehicle are abnormal noise including external environmental noise generated in the vehicle, generate a fifth acoustic event signal; and in response to the fifth acoustic event, adjust volume and equalizer settings of the acoustic service in response to a magnitude and waveform of the abnormal noise within a predetermined range on the basis of a user setting state.

Through the adjuster according to this embodiment, in the case of short-term noise, by adjusting the volume and equalizer settings of the sound service outputted through the speaker only within a certain range based on the user setting state, the user will not feel the change of the sound setting, thereby improving performance of the acoustic control apparatus.

An acoustic control system for adjusting a sound according to an embodiment of the present disclosure may include: at least one microphone configured to collect acoustic signals in a vehicle, generated in the vehicle; a speaker configured to output an acoustic service in the vehicle; and a sound processor configured to analyze acoustic signals in the vehicle, collected from the microphone, and adjust volume and equalizer settings of the acoustic service in response to a result of analyzing the acoustic signals in the vehicle, wherein the sound processor is configured to determine whether the acoustic signals in the vehicle are normal noise or abnormal noise using a first deep neural network model that has been trained in advance to determine whether the acoustic signals are normal noise or abnormal noise generated in the vehicle by analyzing features of the acoustic signals, and the first deep neural network model has been trained through training data in which big data on sounds normally generated in a vehicle are labeled as normal noise.

Through the acoustic control system according to this embodiment, by adjusting the volume and equalizer settings of the acoustic service being outputted from the speaker in response to the magnitude and waveform of the noise when the user is talking with another user in the vehicle, smooth conversation is possible, and when the user uses a voice agent service and an acoustic service (such as music and a navigation guidance voice) in the vehicle, an output acoustic signal of constant and clear sound quality can be outputted.

Further, through the acoustic control system according to this embodiment, by analyzing an acoustic signal using a deep neural network model trained in advance, and enabling adaptive adjustment of the volume and equalizer settings of the acoustic service being outputted in the vehicle according to the analysis result of the acoustic signal, performance and reliability of the acoustic control system can be improved.

In addition, in order to implement the present disclosure, there may be further provided other methods, other systems, and a computer-readable recording medium having a computer program stored thereon to execute the methods.

Other aspects, features, and advantages other than those described above will become apparent from the following drawings, claims, and detailed description of the present disclosure.

According to embodiments of the present disclosure, by estimating the magnitude and waveform of noise collected through an in-vehicle microphone and adaptively adjusting the volume and equalizer setting of an acoustic service being outputted in the vehicle, the user may hear the acoustic service at a volume set by the user regardless of the volume of the noise.

In addition, when an in-vehicle voice agent service is used, the speech recognition performance may be improved by removing a spoken response utterance signal corresponding to the speech recognition result among acoustic signals collected through the microphone and adjusting the volume of a spoken response utterance signal outputted by the speaker according to the magnitude and waveform of the noise, and the user may clearly hear the spoken response utterance signal corresponding to the speech recognition result.

Further, it is possible to analyze an acoustic signal using a deep neural network model trained in advance, and enable adaptive adjustment of the volume and equalizer settings of the acoustic service being outputted in the vehicle according to the analysis result of the acoustic signal, to thereby improve performance and reliability of the acoustic control system.

Further, by adjusting the volume and equalizer settings of the acoustic service being outputted from the speaker in response to the magnitude and waveform of the noise when the user is talking with another user in the vehicle, smooth conversation is possible, and when the user uses a voice agent service and an acoustic service (such as music and a navigation guidance voice) in the vehicle, an output acoustic signal of constant and clear sound quality may be outputted.

In addition, by analyzing the acoustic signal reflecting the vehicle driving mode and adjusting the volume and equalizer settings of the voice agent service and the sound service according to the analysis result, the volume and equalizer settings may be adjusted differently for each user or event, thereby improving user satisfaction.

Further, by enabling adaptive volume and equalizer setting adjustment of the acoustic service being outputted in the vehicle by estimating the magnitude and waveform of the noise generated in the vehicle, the user can listen to a clear acoustic service in any situation, and communication in the vehicle can become smooth, thereby improving user satisfaction toward the acoustic control apparatus.

Further, acoustic event detection performance of an acoustic control apparatus can be improved by analyzing an event pattern for an acoustic signal and applying weight to an acoustic service frequently used by a user or a frequently occurring event.

In addition, by adjusting volume and equalizer settings in various ways for each user or event, the user's needs can be satisfied, thereby improving the user's satisfaction.

In addition, in the case of short-term noise, the volume and equalizer settings of the sound service outputted through the speaker are adjusted only within a certain range based on the user setting state, and accordingly the user will not feel the change of the sound setting. In this way, the performance of the acoustic control apparatus can be improved.

In addition, by performing the acoustic control through 5G network-based communication, it is possible to improve the performance of the acoustic control system since it is possible to quickly process data.

In addition, although an acoustic control apparatus itself is a mass-produced, uniform product, a user may recognize the acoustic control apparatus as a personalized device, and thereby experience the effect of having a user-customized product.

The effects of the present disclosure are not limited to the effects mentioned above, and other effects not mentioned may be clearly understood by those skilled in the art from the following description.

BRIEF DESCRIPTION OF THE DRAWINGS

The foregoing and other aspects, features, and advantages of the present disclosure, as well as the following detailed description of the embodiments, will be better understood when read in conjunction with the accompanying drawings. For the purpose of illustrating the present disclosure, there is shown in the drawings an exemplary embodiment, it being understood, however, that the present disclosure is not intended to be limited to the details shown because various modifications and structural changes may be made therein without departing from the spirit of the present disclosure and within the scope and range of equivalents of the claims. The use of the same reference numerals or symbols in different drawings indicates similar or identical items.

DETAILED DESCRIPTION

Figure 1:
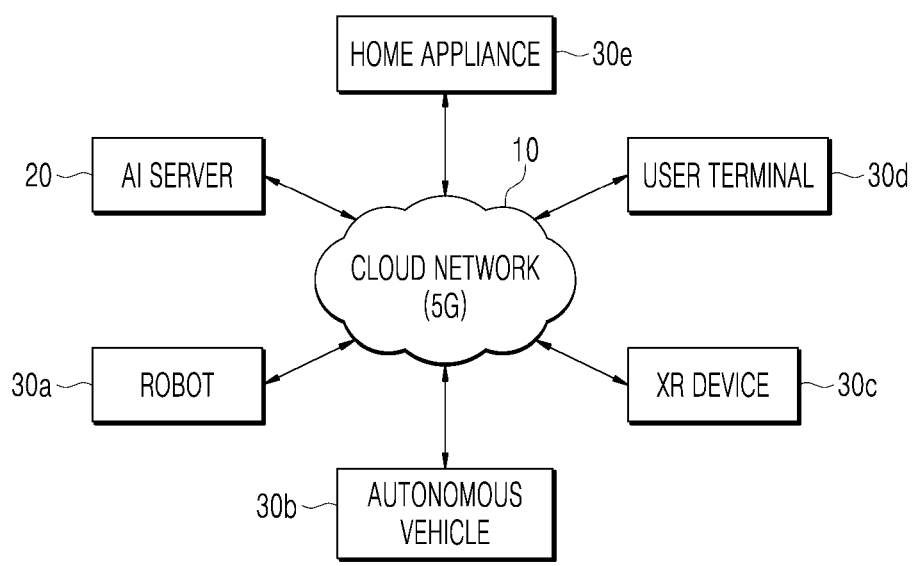
FIG. 1 is a diagram illustrating an AI system-based acoustic control system environment including an AI server, an autonomous vehicle, a robot, an XR device, a user terminal or a home appliance, and a cloud network connecting one or more of these components to each other according to an embodiment of the present disclosure.

Advantages and features of the present disclosure and methods for achieving them will become apparent from the descriptions of aspects herein below with reference to the accompanying drawings. However, the description of particular example embodiments is not intended to limit the present disclosure to the particular example embodiments disclosed herein, but on the contrary, it should be understood that the present disclosure is to cover all modifications, equivalents and alternatives falling within the spirit and scope of the present disclosure. The example embodiments disclosed below are provided so that the present disclosure will be thorough and complete, and also to provide a more complete understanding of the scope of the present disclosure to those of ordinary skill in the art. In the interest of clarity, not all details of the relevant art are described in detail in the present specification in so much as such details are not necessary to obtain a complete understanding of the present disclosure.

The terminology used herein is used for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. Furthermore, these terms such as "first," "second," and other numerical terms, are used only to distinguish one element from another element. These terms are generally only used to distinguish one element from another.

A vehicle described in the present specification may refer to a car, an automobile, and a motorcycle. Hereinafter, the vehicle will be exemplified as an automobile.

The vehicle described in the present disclosure may include, but is not limited to, a vehicle having an internal combustion engine as a power source, a hybrid vehicle having an engine and an electric motor as a power source, and an electric vehicle having an electric motor as a power source.

Hereinafter, embodiments of the present disclosure will be described in detail with reference to the accompanying drawings. Like reference numerals designate like elements throughout the specification, and overlapping descriptions of the elements will not be provided.

FIG. 1 is a diagram illustrating an AI system-based acoustic control system environment including an AI server, an autonomous vehicle, a robot, an XR device, a user terminal or a home appliance, and a cloud network connecting one or more of these components to each other according to an embodiment of the present disclosure.

Referring to FIG. 1, an AI system-based acoustic control system environment may include an AI server 20, a robot 30a, an autonomous vehicle 30b, an XR device 30c, a user terminal 30d or a home appliance 30e, and a cloud network 10. Here, in the AI system-based acoustic control system environment, one or more of the AI server 20, the robot 30a, the autonomous vehicle 30b, the XR device 30c, and the user terminal 30d or the home appliance 30e may be connected to the cloud network 10. Here, the robot 30a, the autonomous vehicle 30b, the XR device 30c, and the user terminal 30d or the home appliance 30e, to which AI technology is applied, may be referred to as AI devices 30a to 30e.

The robot 30a may refer to a machine which automatically handles a given task by its own ability, or which operates autonomously. In particular, a robot having a function of recognizing an environment and performing an operation according to its own determination may be referred to as an intelligent robot. Robots 30a may be classified into industrial, medical, household, and military robots, according to the purpose or field of use.

The self-driving vehicle 30b refers to a vehicle which travels without manipulation of a user or with minimal manipulation of the user, and may also be referred to as an autonomous-driving vehicle. For example, autonomous driving may include a technology in which a driving lane is maintained, a technology such as adaptive cruise control in which a speed is automatically adjusted, a technology in which a vehicle automatically drives along a defined route, and a technology in which a route is automatically set when a destination is set. In this case, an autonomous vehicle may be considered as a robot with an autonomous driving function.

The XR device 30c refers to a device using extended reality (XR), which collectively refers to virtual reality (VR), augmented reality (AR), and mixed reality (MR). VR technology provides objects or backgrounds of the real world only in the form of CG images, AR technology provides virtual CG images overlaid on the physical object images, and MR technology employs computer graphics technology to mix and merge virtual objects with the real world. XR technology may be applied to a head-mounted display (HMD), a head-up display (HUD), a mobile phone, a tablet PC, a laptop computer, a desktop computer, a TV, digital signage, and the like.

A device employing XR technology may be referred to as an XR device.

The user terminal 30d may be provided with a service for operating or controlling the acoustic control system through an authentication process after accessing an acoustic control system operating application or an acoustic control system operating site. In the present embodiment, the user terminal 30d that has completed the authentication process may operate an acoustic control system 1 and control the operation of an acoustic control apparatus 100. In the present embodiment, the user terminal 30d may be a desktop computer, a smartphone, a notebook, a tablet PC, a smart TV, a cell phone, a personal digital assistant (PDA), a laptop, a media player, a micro server, a global positioning system (GPS) device, an electronic book terminal, a digital broadcast terminal, a navigation device, a kiosk, an MP3 player, a digital camera, a home appliance, and other mobile or immobile computing devices operated by the user, but is not limited thereto. In addition, the user terminal 30d may be a wearable terminal having a communication function and a data processing function, such as a watch, glasses, a hair band, and a ring. The user terminal 30d is not limited thereto. Any terminal that is capable of performing web browsing may be used without limitation.

The home appliance 30e may include any one among electronic devices provided in a home. In particular, the home appliance 30e may include a terminal capable of implementing voice recognition, artificial intelligence, and the like, and a terminal for outputting at least one of an audio signal or a video signal. In addition, the home appliance 30e may include various home appliances (for example, a washing machine, a drying machine, a clothes processing apparatus, an air conditioner, a kimchi refrigerator, or the like) without being limited to specific electronic devices.

The cloud network 10 may include part of the cloud computing infrastructure or refer to a network existing in the cloud computing infrastructure. Here, the cloud network 10 may be constructed by using a 3G network, a 4G or Long Term Evolution (LTE) network, or a 5G network. That is, the devices 30a to 30e and 20 constituting the AI system-based acoustic control system environment may be connected to each other through the cloud network 10. In particular, each individual device (30a to 30e, 20) may communicate with each other through a base station, but may also communicate directly to each other without relying on the base station.

The cloud network 10 may include, for example, wired networks such as local area networks (LANs), wide area networks (WANs), metropolitan area networks (MANs), and integrated service digital networks (ISDNs), or wireless networks such as wireless LANs, CDMA, Bluetooth, and satellite communication, but the scope of the present disclosure is not limited thereto. Furthermore, the cloud network 10 may transmit and receive information using short-range communications or long-distance communications. The short-range communication may include Bluetooth®, radio frequency identification (RFID), infrared data association (IrDA), ultra-wideband (UWB), ZigBee, and Wi-Fi (wireless fidelity) technologies, and the long-range communication may include code division multiple access (CDMA), frequency division multiple access (FDMA), time division multiple access (TDMA), orthogonal frequency division multiple access (OFDMA), and single carrier frequency division multiple access (SC-FDMA).

The cloud network 10 may include connection of network elements such as hubs, bridges, routers, switches, and gateways. The cloud network 10 may include one or more connected networks, including a public network such as the Internet and a private network such as a secure corporate private network.

For example, the network may include a multi-network environment. The access to the cloud network 10 can be provided via one or more wired or wireless access networks. Furthermore, the cloud network 10 may support 5G communication and/or an Internet of things (IoT) network for exchanging and processing information between distributed components such as objects.

The AI server 20 may include a server performing AI processing and a server performing computations on big data. In addition, the AI server 20 may be a database server that provides big data necessary for applying various artificial intelligence algorithms and data for operating the acoustic control system 1. In addition, the AI server 20 may include a web server or an application server that enables remote control of the operation of the acoustic control apparatus 100 using the acoustic control system operating application or the acoustic control system operating web browser installed in the user terminal 30d.

In addition, the AI server 20 may be connected, through the cloud network 10, to at least one of the robot 30a, the autonomous vehicle 30b, the XR device 30c, the user terminals 30d, or the home appliance 30e, which are AI devices constituting the AI system-based acoustic control system environment, and may assist with the AI processing of the connected AI devices 30a to 30e. Here, the AI server 20 may train the AI network according to a machine learning algorithm instead of the AI devices 30a to 30e, and may directly store a learning model or transmit the learning model to the AI devices 30a to 30e. Here, the AI server 20 may receive input data from the AI device 30a to 30e, infer a result value from the received input data by using the learning model, generate a response or control command based on the inferred result value, and transmit the generated response or control command to the AI device 30a to 30e. Similarly, the AI device 30a to 30e may infer a result value from the input data by employing the learning model directly and generate a response or control command based on the inferred result value.

Artificial intelligence (AI) is an area of computer engineering science and information technology that studies methods to make computers mimic intelligent human behaviors such as reasoning, learning, self-improving, and the like.

In addition, artificial intelligence does not exist on its own, but is rather directly or indirectly related to a number of other fields in computer science. In recent years, there have been numerous attempts to introduce an element of AI into various fields of information technology to solve problems in the respective fields.

Machine learning is an area of artificial intelligence that includes the field of study that gives computers the capability to learn without being explicitly programmed. More specifically, machine learning is a technology that investigates and builds systems, and algorithms for such systems, which are capable of learning, making predictions, and enhancing their own performance on the basis of experiential data. Machine learning algorithms, rather than only executing rigidly set static program commands, may take an approach that builds models for deriving predictions and decisions from inputted data.

The present embodiment particularly relates to the self-driving vehicle 30b. Thus, among the above-mentioned AI devices to which the technology is applied, the self-driving vehicle 30b will be described in the embodiments below. However, in the present embodiment, the vehicle (200 of FIG. 2) is not limited to the self-driving vehicle 30b, and may refer to any vehicles, including the self-driving vehicle 30b and general vehicles. In the present embodiment, a vehicle in which the acoustic control system 1 is disposed may be used as an example.

Figure 2:
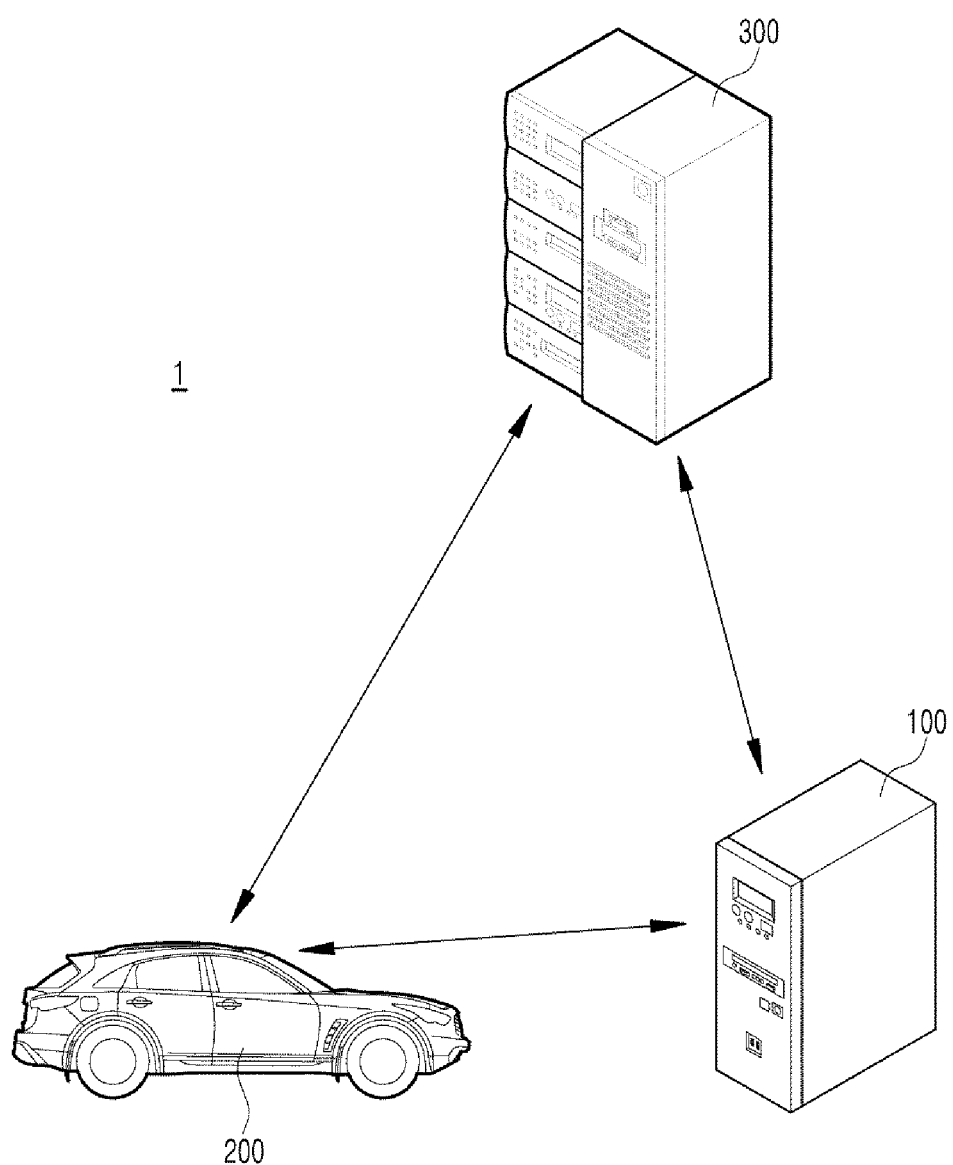
FIG. 2 is a diagram schematically illustrating a communication environment of an acoustic control system according to an embodiment of the present disclosure.

FIG. 2 is a diagram schematically illustrating a communication environment of an acoustic control system according to an embodiment of the present disclosure. Hereinbelow, the common parts previously described with reference to FIG. 1 will not be described, so as to avoid repetitive description.

Referring to FIG. 2, an acoustic control system 1 essentially includes an acoustic control apparatus 100, a vehicle 200, and a server 300, and may further include other components such as a user terminal and a network. In this case, the acoustic control apparatus 100 may be disposed in the vehicle 200, but the present disclosure is not limited to this example. Also, in the present embodiment, a "user" may refer to a driver of the vehicle 200, and "another passenger" may refer to a passenger other than the driver. In addition, the driver of the vehicle 200 may be a driver previously registered in the vehicle 200, and one or more drivers may be registered in advance. In the case of a call in the vehicle 200 being made using a hands-free function, a "near-end speaker" may refer to a user having a conversation on the phone in the vehicle 200, and a "far-end speaker" may refer to a counterpart user talking to the near-end speaker. For example, the user who makes a call in the vehicle 200 may be a driver, but is not limited thereto. The user may refer to another user in the vehicle 200 who communicates through the hands-free function in the vehicle 200.

In this embodiment, the server 300 may include an AI server 20, a mobile edge computing (MEC) server, and a server for the process of the acoustic control apparatus 100 of FIG. 1 or may mean a combination of these. When the server 300 is another server that is not specified in the present embodiment, the connection relationship illustrated in FIG. 2 may be changed.

The AI server may receive data for acoustic control from the vehicle 200, analyze the in-vehicle acoustic signals collected in the vehicle, and perform learning for adjustment of the volume and equalizer settings of output acoustic signals (speech recognition service, acoustic service) outputted in the vehicle according to the analysis result of the in-vehicle acoustic signals. Further, the AI server may transmit the analysis result of the acoustic signals and the learning result for acoustic control such as adjustment of the volume and equalizer settings of the acoustic signals, to the vehicle 200 so that the operation for acoustic control, that is, the operation for acoustic signal adjustment such as volume and equalizer setting adjustment of acoustic signals outputted by the speaker, may be performed in the vehicle.

The MEC server may act as a general server, and may be connected to a base station (BS) next to a road in a radio access network (RAN) to provide flexible vehicle-related services and efficiently operate the network. In particular, network-slicing and traffic scheduling policies supported by the MEC server can assist the optimization of the network. The MEC server is integrated inside the RAN, and may be located in an S1-user plane interface (for example, between the core network and the base station) in a 3GPP system. The MEC server may be regarded as an independent network element, and does not affect the connection of the existing wireless networks. The independent MEC servers may be connected to the base station via the dedicated communication network and may provide specific services to various end-users located in the cell. These MEC servers and the cloud servers may be connected to each other through an Internet-backbone, and share information with each other. The MEC server may operate independently, and control a plurality of base stations. Services for self-driving vehicles, application operations such as virtual machines (VMs), and operations at the edge side of mobile networks based on a virtualization platform may be performed. The base station (BS) may be connected to both the MEC servers and the core network to enable flexible user traffic scheduling required for performing the provided services. When a large amount of user traffic occurs in a specific cell, the MEC server may perform task offloading and collaborative processing based on the interface between neighboring base stations. That is, since the MEC server has an open operating environment based on software, new services of an application provider may be easily provided. Since the MEC server performs the service at a location near the end-user, the data round-trip time is shortened and the service providing speed is high, thereby reducing the service waiting time. MEC applications and virtual network functions (VNFs) may provide flexibility and geographic distribution in service environments. When using this virtualization technology, various applications and network functions can be programmed, and only specific user groups may be selected or compiled for them. Therefore, the provided services may be applied more closely to user requirements. In addition to centralized control ability, the MEC server may minimize interaction between base stations. This may simplify the process for performing basic functions of the network, such as handover between cells. This function may be particularly useful in autonomous driving systems used by a large number of users. In the autonomous driving system, the terminals of the road may periodically generate a large amount of small packets. In the RAN, the MEC server may reduce the amount of traffic that must be delivered to the core network by performing certain services. This may reduce the processing burden of the cloud in a centralized cloud system, and may minimize network congestion. The MEC server may integrate network control functions and individual services, which can increase the profitability of Mobile Network Operators (MNOs). Installation density adjustment enables fast and efficient maintenance and upgrades.

Meanwhile, in the present embodiment, the vehicle 200 may include a vehicle communication module, a vehicle control module, a vehicle user interface module, a driving manipulation module, a vehicle driving module, an operation module, a navigation module, a sensing module, and the like. The vehicle 200 may include other components than the components described, or may not include some of the components described, depending on the embodiment.

Here, the vehicle 200 may be a self-driving vehicle, and may be switched from an autonomous driving mode to a manual mode, or switched from the manual mode to the autonomous driving mode according to a user input received through the vehicle user interface module. In addition, the vehicle 200 may be switched from an autonomous mode to a manual mode, or switched from the manual mode to the autonomous mode depending on the driving situation. Here, the driving situation may be judged by at least one of information received by the vehicle communication module, external object information detected by the sensing module, or navigation information acquired by the navigation module.

Meanwhile, in the present embodiment, the vehicle 200 may receive a service request (user input) from the user for control. The method by which the vehicle 200 receives the service provision request from the user may include, for example, the case of receiving a touch (or button input) signal for the vehicle user interface module from the user, and the case of receiving the speech corresponding to the service request from the user. In this case, the touch signal reception and the speech reception from the user may be possible via the user terminal (30*d* of FIG. 1). In addition, the speech reception may be provided by a separate microphone which executes a speech recognition function. In this case, the microphone may be the microphone (2 of FIG. 3) of the present embodiment.

When the vehicle 200 is operated in the autonomous mode, the vehicle 200 may be operated according to the control of the operation module that controls driving, parking, and unparking operations. Meanwhile, when the vehicle 200 is driven in the manual mode, the vehicle 200 may be driven by a user input through the driving manipulation module. The vehicle 200 may be connected to an external server through a communication network, and may be capable of moving along a predetermined route without a driver's intervention by using an autonomous driving technique.

The vehicle user interface module is used for communication between the vehicle 200 and the vehicle user. The vehicle user interface module may receive an input signal of the user, transmit the received input signal to the vehicle user interface module, and provide information held by the vehicle 200 to the user by the control of the vehicle control module. The vehicle user interface module may include, but is not limited to, an input module, an internal camera, a bio-sensing module, and an output module.

The input module is for receiving information from a user. The data collected by the input module may be analyzed by the vehicle control module and processed by the user's control command. In addition, the input module may receive a destination of the vehicle 200 from the user and provide the destination to the vehicle control module. Further, the input module may input a signal for designating and inactivating at least one of the plurality of sensor modules of the sensing module to the vehicle control module according to the user's input. The input module may be disposed inside the vehicle. For example, the input module may be disposed on one area of a steering wheel, one area of an instrument panel, one area of a seat, one area of each pillar, one area of a door, one area of a center console, one area of a head lining, one area of a sun visor, one area of a windshield, or one area of a window. In particular, in the present embodiment, the input module may include one or more microphones (2 of FIG. 3) to collect acoustic signals in the vehicle.

The output module is for generating an output related to sight, hearing, or tactile sense, and may output a sound or an image. Furthermore, the output module may include at least one of a display module, a sound output module, and a haptic output module.

The display module may display graphic objects corresponding to various information. The display module may include at least one of a liquid crystal display (LCD), a thin film transistor liquid crystal display (TFT LCD), an organic light emitting diode (OLED), a flexible display, a 3D display, or an e-ink display. The display module may have a mutual layer structure with a touch input module, or may be integrally formed to implement a touch screen. The display module may be implemented as a head-up display (HUD). When the display module is implemented as an HUD, the display module may include a projection module to output information through an image projected onto a windshield or a window. The display module may include a transparent display. The transparent display may be attached to the windshield or the window. The transparent display may display a predetermined screen with a predetermined transparency. The transparent display may include at least one of a transparent thin film electroluminescent (TFEL), a transparent organic light-emitting diode (OLED), a transparent liquid crystal display (LCD), a transmissive transparent display, or a transparent light emitting diode (LED). The transparency of the transparent display may be adjusted. The vehicle user interface module may include a plurality of display modules. The display module may be disposed in one area of the steering wheel, one area of the instrument panel, one area of the seat, one area of each pillar, one area of the door, one area of the center console, one area of the head lining, or one area of the sun visor, or may be implemented on one area of the windshield or one area of the window.

The sound output module may convert an electrical signal provided from the vehicle control module into an audio signal. To this end, the sound output module may include one or more speakers (3 of FIG. 3). The haptic output module may generate a tactile output. For example, the haptic output module may operate to allow the user to perceive the output by vibrating a steering wheel, a seat belt, and a seat.

The driving manipulation module may receive a user input for driving. In the case of the manual mode, the vehicle 200 may operate based on the signal provided by the driving manipulation module. That is, the driving manipulation module may receive an input for the operation of the vehicle 200 in the manual mode, and may include a steering input module, an acceleration input module, and a brake input module, but the present disclosure is not limited thereto.

The vehicle driving module may electrically control the driving of various devices in the vehicle 200, and may include a powertrain driving module, a chassis driving module, a door/window driving module, a safety device driving module, a lamp driving module, and an air conditioning driving module, but the present disclosure is not limited thereto.

The operation module may control various operations of the vehicle 200, and in particular, may control various operations of the vehicle 200 in the autonomous driving mode. The operation module may include a driving module, an unparking module, and a parking module, but is not limited thereto. In addition, the operation module may include a processor under the control of the vehicle control module. Each module of the operation module may include a processor individually. When the operation module is implemented in software, it may be a sub-concept of the vehicle control module, depending on the embodiment.

The driving module, the unparking module, and the parking module may respectively drive, unpark, and park the vehicle 200. In addition, the driving module, the unparking module, and the parking module may each receive object information from the sensing module, and provide a control signal to the vehicle driving module, and thereby drive, unpark, and park the vehicle 200. In addition, the driving module, the unparking module, and the parking module may each receive a signal from an external device through the vehicle communication module, and provide a control signal to the vehicle driving module, and thereby drive, unpark, and park the vehicle 200. In addition, the driving module, the unparking module, and the parking module may each receive navigation information from the navigation module, and provide a control signal to the vehicle driving module, and thereby drive, unpark, and park the vehicle 200. The navigation module may provide the navigation information to the vehicle control module. The navigation information may include at least one of map information, set destination information, route information according to destination setting, information about various objects on the route, lane information, or current location information of the vehicle. The navigation module may provide the vehicle controller with a parking lot map of the parking lot entered by the vehicle 200. When the vehicle 200 enters the parking lot, the vehicle controller receives the parking lot map from the navigation module, and projects the calculated route and fixed identification information on the provided parking lot map so as to generate the map data. The navigation module may include a memory. The memory may store navigation information. The navigation information can be updated by the information received through the vehicle communication module. The navigation module may be controlled by a built-in processor or may be operated by receiving an external signal, for example, a control signal from the vehicle control module, but the present disclosure is not limited to this example.

The sensing module can sense the state of the vehicle 200, that is, detect a signal about the state of the vehicle 200, by using a sensor mounted on the vehicle 200, and acquire route information of the vehicle according to the sensed signal. In addition, the sensing module may provide acquired movement path information to the vehicle control module. In addition, the sensing module may sense an object around the vehicle 200 using a sensor mounted in the vehicle 200.

Further, the sensing module is for detecting an object located outside the vehicle 200. The sensing module can generate object information based on the sensing data and transmit the generated object information to the vehicle control module. At this time, the object may include various objects related to the driving of the vehicle 200, such as a lane, another vehicle, a pedestrian, a motorcycle, a traffic signal, a light, a road, a structure, a speed bump, a landmark, and an animal. The sensing module may be composed of a plurality of image acquirers, and may include a camera module, a light imaging detection and ranging (lidar), an ultrasonic sensor, a radio detection and ranging (radar), and an infrared sensor as a plurality of image acquirers. The sensing module may sense environment information around the vehicle 200 through the plurality of sensor modules. The sensing module may further include components other than the components described, or may not include some of the components described, depending on the embodiment. The radar may include an electromagnetic wave transmitting module and an electromagnetic wave receiving module. The radar may be implemented by a pulse radar system or a continuous wave radar system in terms of the radio wave emission principle. The radar may be implemented by a frequency modulated continuous wave (FMCW) scheme or a frequency shift keying (FSK) scheme among continuous wave radar schemes, depending on the signal waveform. The radar may detect an object based on a time-of-flight (TOF) scheme or a phase-shift scheme by using an electromagnetic wave as a medium, and may detect the position of the detected object, the distance to the detected object, and a relative speed of the detected object. The infrared radar may be disposed at an appropriate location outside the vehicle 200 in order to sense objects located at the front, rear or side portions of the vehicle 200.

The lidar may include a laser transmitting module and a laser receiving module. The lidar may be implemented in a TOF scheme or a phase-shift scheme. The lidar may be implemented as a driven type or a non-driven type. When implemented as a driven type, the lidar may be rotated by the motor, and is capable of detecting objects around the vehicle 200, and when implemented as a non-driven type, the lidar may detect objects located within a predetermined range on the basis of the vehicle 200. The vehicle 200 may include a plurality of non-driven type lidars. The lidar may detect an object based on a TOF scheme or a phase-shift scheme by using a laser beam as a medium, and may detect the position of the detected object, the distance to the detected object, and the relative speed of the detected object. The lidar may be disposed at an appropriate location outside the vehicle 200 in order to sense objects located at the front, rear or side portions of the vehicle 200.

The image acquirer may be located at a suitable place outside the vehicle 200, for example, the front side, the rear side, the right side mirror, and the left side mirror of the vehicle 200 in order to acquire an external image of the vehicle 200. The image acquirer may be a mono camera, but is not limited thereto, and may be a stereo camera, an around view monitoring (AVM) camera, or a 360 degree camera. The image acquirer may be disposed in close proximity to the front windshield in the interior of the vehicle 200 to acquire an image in front of the vehicle 200. Alternatively, the image acquirer may be disposed around a front bumper or a radiator grill. The image acquirer may be disposed in close proximity to the rear glass in the interior of the vehicle in order to acquire an image at the rear of the vehicle 200. Alternatively, the image acquirer may be disposed around a rear bumper, trunk, or tailgate. The image acquirer may be disposed in close proximity to at least one of the side windows in the interior of the vehicle 200 in order to acquire an image at the side portions of the vehicle 200. In addition, the image acquirer may be disposed around the fender or door.

The ultrasonic sensor may include an ultrasonic transmission module and an ultrasonic reception module. The ultrasonic sensor can detect an object based on ultrasonic waves, and can detect the position of the detected object, the distance to the detected object, and the relative speed of the detected object. The ultrasonic sensor may be disposed at an appropriate location outside the vehicle 200 in order to sense objects located at the front, rear, or side portion of the vehicle 200. The infrared sensor may include an infrared transmission module and an infrared reception module. The infrared sensor can detect an object based on the infrared light, and can detect the position of the detected object, the distance to the detected object, and the relative speed of the detected object. The infrared sensor may be disposed at an appropriate location outside the vehicle 200 in order to sense objects located at the front, rear or side portions of the vehicle 200.

The vehicle control module may control the overall operation of each module of the sensing module. The vehicle control module may detect or classify an object by comparing data sensed by the radar, the lidar, the ultrasonic sensor, and the infrared sensor with previously stored data. The vehicle control module may detect and track the object based on the acquired image. The vehicle control module can perform operations such as calculating a distance to an object and calculating a relative speed with respect to the object through an image processing algorithm. For example, the vehicle control module can acquire information on the distance to the object, information on the relative speed with respect to the object on the basis of the variation of the object size with time in the acquired image. For example, the vehicle control module can obtain information on the distance to the object and information on the relative speed through, for example, a pin hole model and road surface profiling.

The vehicle control module may detect and track the object based on the reflected wave (or reflected light) in which at least one of the transmitted electromagnetic wave, laser, ultrasonic wave, or infrared light is reflected by the object and returned. The vehicle control module can perform operations such as calculating a distance to an object and calculating a relative speed with respect to the object based on the reflected wave (or reflected light). The sensing module may include a processor separate from the vehicle control module, depending on the embodiment. In addition, each of the radar, the lidar, the ultrasonic sensor and the infrared sensor may include a processor. When the sensing module includes a processor, the sensing module may be operated under the control of the processor under the control of the vehicle control module.

Meanwhile, sensing module may include sensors such as a position sensor (for example, a yaw sensor, a roll sensor, a pitch sensor), a crash sensor, a wheel sensor, a speed sensor, an inclination sensor, a weight sensor, a heading sensor, a gyro sensor, a position module, a vehicle forward/reverse sensor, a battery sensor, a fuel sensor, a tire sensor, a steering sensor by steering wheel rotation, a vehicle interior temperature sensor, a vehicle interior humidity sensor, an ultrasonic sensor, an illuminance sensor, an accelerator pedal position sensor, and a brake pedal position sensor. The sensing module may further include sensors such as an accelerator pedal sensor, a pressure sensor, an engine speed sensor, an air flow sensor (AFS), an intake air temperature sensor (ATS), a water temperature sensor (WTS), a throttle position sensor (TPS), a TDC sensor, and a crank angle sensor (CAS). The sensing module can generate vehicle state information based on the sensing data. The vehicle status information may be information generated based on data sensed by various sensors provided in the vehicle. Vehicle state information may include information such as attitude information of the vehicle, speed information of the vehicle, tilt information of the vehicle, weight information of the vehicle, direction information of the vehicle, battery information of the vehicle, fuel information of the vehicle, tire air pressure information of the vehicle, steering information of the vehicle, interior temperature information of the vehicle, interior humidity information of the vehicle, pedal position information, and vehicle engine temperature information.

Figure 3:
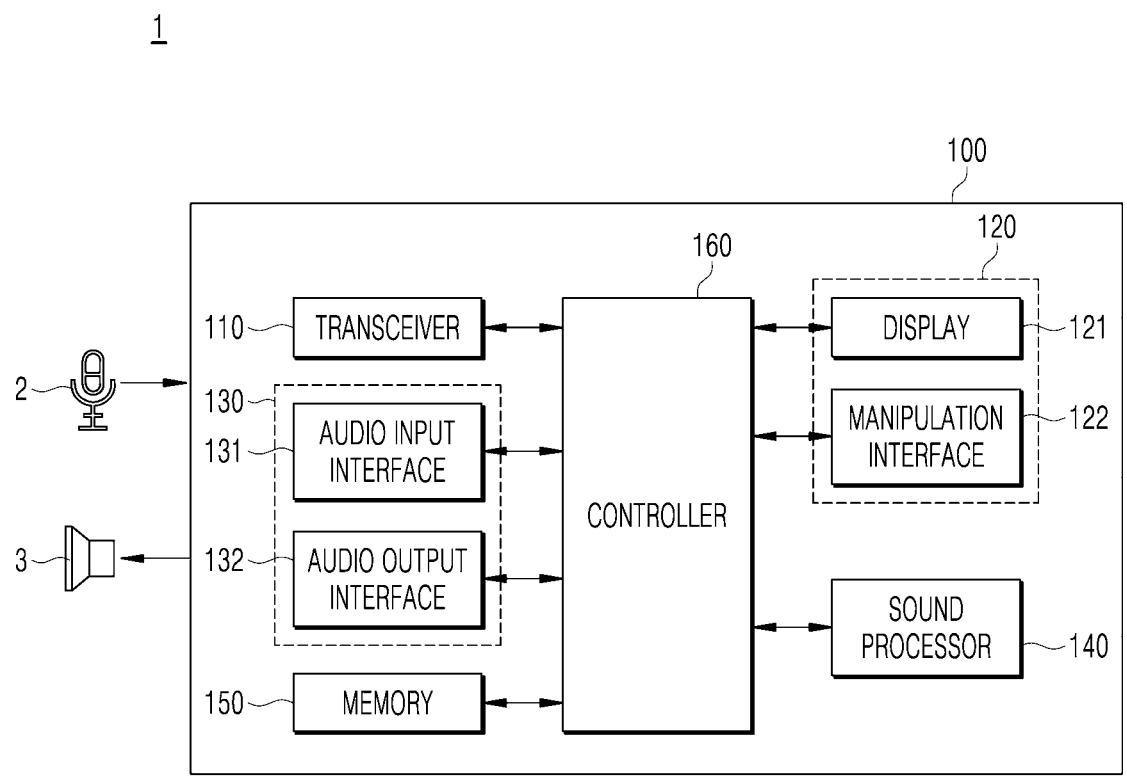
FIG. 3 is a schematic block diagram of an acoustic control system according to an embodiment of the present disclosure.

FIG. 3 is a schematic block diagram of an acoustic control system according to an embodiment of the present disclosure. In the following description, description of parts that are the same as those in FIG. 1 and FIG. 2 will be omitted.

Referring to FIG. 3, the acoustic control system 1 may include a microphone 2, a speaker 3, and an acoustic control apparatus 100. In the present embodiment, when the output acoustic signal (speech recognition service, acoustic service) is being outputted through the speaker 3 in the vehicle, the noise may be detected based on the analysis result by analyzing the in-vehicle acoustic signals collected through the microphone 2, and by adjusting the volume and equalizer settings of the output acoustic signal outputted through the speaker 3 to correspond to the detected noise, the user can hear acoustic signals of constant sound quality. Further, in the present embodiment, situations to which the acoustic control system 1 may be applied may include, for example, making a call using a hands-free function, using an acoustic service such as music and navigation, two or more users talking to each other, using a speech recognition service, and a baby crying. However, in the present embodiment, although the vehicle 200 is taken as an example, even when the acoustic control system 1 is disposed in, for example, a smart speaker or headphones, it is possible to feel a clear hearing effect in a noisy environment.

Meanwhile, in the present embodiment, the acoustic signal in the vehicle may refer to an acoustic signal collected through the microphone 2, and the output acoustic signal may refer to an acoustic signal outputted through the speaker 3 provided in the vehicle. Also, the output acoustic signal may include a speech recognition service and an acoustic service. The speech recognition service may refer to a service in which a spoken response utterance signal corresponding to a spoken utterance of the user is outputted through a voice agent system, and the acoustic service may refer to all output acoustic signals which can be provided through the speaker 3 in the vehicle. The acoustic service may include, for example, music, a navigation guidance voice, and a vehicle warning sound. Also, in the present embodiment, the speech recognition service and the sound service are distinguished, but the speech recognition service may be included in the acoustic service, and the speech recognition service and the acoustic service may be outputted through different speakers at the same time. When the speech recognition service and the sound service are outputted at the same time, the priority for sound control may be set at an initial stage, or be changed by the user. That is, hereinafter, the in-vehicle acoustic signal may include all acoustic signals that can be collected through the microphone 2 in the vehicle, and the output acoustic signal may include the speech recognition service and the acoustic service.

The microphone 2 is a means for receiving acoustic input, and may collect in-vehicle acoustic signals generated in a travelling vehicle. In addition, one or more microphones 2 may be provided, and in the present embodiment, two or more microphones 2 may be provided.

The speaker 3 is an acoustic output means, and may output an output acoustic signal which can be outputted in a vehicle. In the present embodiment, an output acoustic signal in which volume and equalizer settings are adjusted may be outputted in response to a result of analyzing the acoustic signal in the vehicle. In this case, the speaker 3 may be provided with two or more speakers 3, and the microphone 2 and the speaker 3 may be implemented by devices provided in the vehicle 200. In addition, although the position of the microphone 2 and the speaker 3 is not limited, the microphone 2 may be provided at the driver's seat side, and the speaker 3 may be provided according to the seat position.

Referring to the acoustic control apparatus 100 in more detail, the acoustic control apparatus 100 may include a transceiver 110, a user interface 120, an audio processor 130, a sound processor 140, a memory 150, and a controller 160.

The transceiver 110 may be a vehicle communication module for performing communication between the vehicle 200 and an external device. The transceiver 110 may support communication in a plurality of communication modes, receive a server signal from a server, and transmit a signal to the server. In addition, the transceiver 110 may receive a signal from another vehicle, transmit a signal to another vehicle, receive a signal from a user terminal, and transmit a signal to the user terminal. That is, the external device may include another vehicle, a user terminal, and a server system. In addition, the transceiver 110 may include a communication module for communication in the vehicle. Herein, the plurality of communication modes may include an inter-vehicle communication mode for communicating with another vehicle, a server communication mode for communicating with an external server, a short-range communication mode for communicating with a user terminal such as an in-vehicle user terminal, and an in-vehicle communication mode for communicating with in-vehicle units. That is, the transceiver 110 may include modules such as a wireless communication module, a V2X communication module, and a short range communication module. In addition, the transceiver 110 may include a position information module that receives a signal including location information of the vehicle 200. The position information module may include a global positioning system (GPS) module or a differential global positioning system (DGPS) module.

The wireless communication module may transmit and receive signals to and from a user terminal or a server through a mobile communication network. Here, the mobile communication network is a multiple access system capable of supporting communication with multiple users by sharing used system resources (bandwidth, transmission power, or the like). Examples of the multiple access system include a code division multiple access (CDMA) system, a frequency division multiple access (FDMA) system, a time division multiple access (TDMA) system, an orthogonal frequency division multiple access (OFDMA) system, a single carrier frequency division multiple access (SC-FDMA) system, and a multi-carrier frequency division multiple access (MC-FDMA) system.

The V2X communication module may transmit and receive a signal with an RSU through a V2I communication protocol in a wireless manner, may transmit and receive a signal with another vehicle, that is, a vehicle near the vehicle 200 within a certain distance, through a V2V communication protocol, and may transmit and receive a signal to and from a smartphone, that is, a pedestrian or a user, through a V2P communication protocol. That is, the V2X communication module may include an RF circuit capable of implementing protocols of communication with infrastructure (V2I), inter-vehicle communication (V2V), and communication with a user terminal (V2P). That is, the transceiver 110 may include at least one of a transmission antenna, a reception antenna, a radio frequency (RF) circuit capable of implementing various communication protocols, and an RF element in order to perform communication.

The short range communication module may be connected to the user terminal of the driver through a short range wireless communication module. In this case, the short-range communication module may be connected to the user terminal through wired communication as well as wireless communication. For example, if the user terminal of the driver is registered in advance, the short-range communication module allows the user terminal to be automatically connected to the vehicle 200 when the registered user terminal is recognized within a predetermined distance from the vehicle 200 (for example, when inside the vehicle). That is, the transceiver 110 can perform short range communication, GPS signal reception, V2X communication, optical communication, broadcast transmission/reception, and intelligent transport systems (ITS) communication functions. The transceiver 110 may support short-range communication by using at least one among Bluetooth™, radio frequency identification (RFID), Infrared Data Association (IrDA), Ultra Wideband (UWB), ZigBee, near field communication (NFC), Wi-Fi, Wi-Fi Direct, or Wireless Universal Serial Bus (USB) technologies. The transceiver 110 may further support other functions than the functions described, or may not support some of the functions described, depending on the embodiment.

Depending on the embodiment, the overall operation of each module of the transceiver 110 may be controlled by a separate processor provided in the transceiver 110. The transceiver 110 may include a plurality of processors, or may not include a processor. When a processor is not included in the transceiver 110, the transceiver 110 may be operated by either a processor of another apparatus in the vehicle 200 or the vehicle controller. The transceiver 110 may, together with the vehicle user interface, implement a vehicle-use display device. In this case, the vehicle display device may be referred to as a telematics device or an audio video navigation (AVN) device.

Meanwhile, in the present embodiment, the transceiver 110 may receive a result of determining whether an acoustic signal in the vehicle is normal noise or abnormal noise, by using a deep neural network model trained in advance to determine whether the acoustic signal is normal noise or abnormal noise generated in the vehicle by analyzing features of the acoustic signal, based on a downlink grant of a 5G network connected to operate a vehicle having an acoustic control system 1 built therein in autonomous driving mode. In this case, the transceiver 110 may receive acoustic signal information and noise information generated in the vehicle according to the driving operation of the vehicle 200 from the AI server connected to the 5G network.

Figure 4:
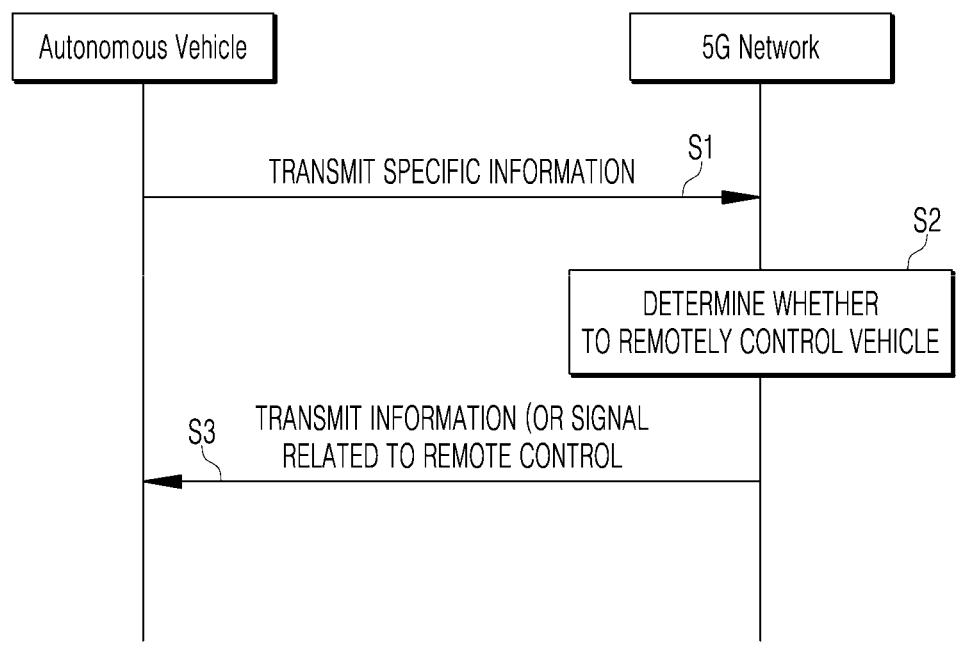
FIG. 4 is a diagram showing an example of the basic operation of an autonomous vehicle and a 5G network in a 5G communication system.
Figure 5:
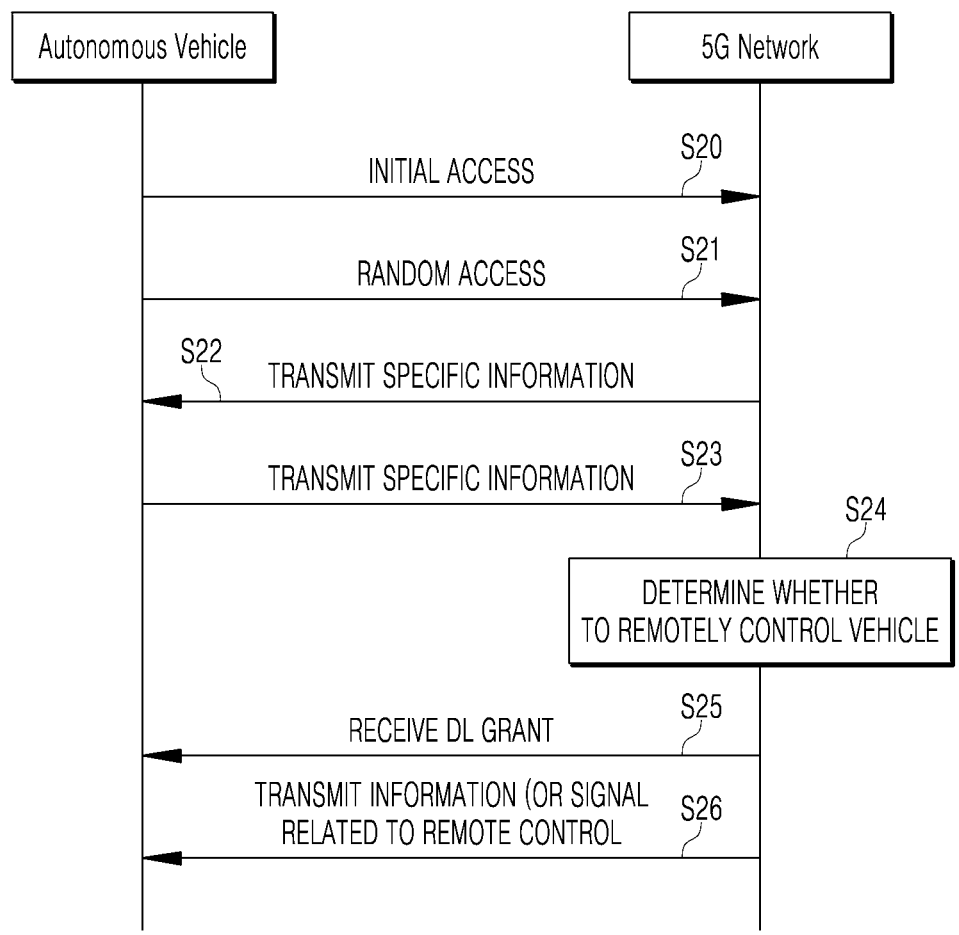
FIG. 5 is a diagram showing an example of an application operation of an autonomous vehicle and a 5G network in a 5G communication system.

FIG. 4 is a diagram illustrating an example of the basic operation of an autonomous vehicle and a 5G network in a 5G communication system.

The transceiver 110 may transmit specific information over a 5G network when the vehicle 200 is operated in the autonomous driving mode.

The specific information may include autonomous driving related information.

The autonomous driving related information may be information directly related to the driving control of the vehicle. For example, the autonomous driving related information may include at least one of object data indicating an object near the vehicle, map data, vehicle status data, vehicle location data, or driving plan data.

The autonomous driving related information may further include service information necessary for autonomous driving. For example, the specific information may include information about the destination and the stability level of the vehicle, which are inputted through the user interface 120 as in FIG. 3.

In addition, the 5G network can determine whether the vehicle is remotely controlled (S2).

The 5G network may include a server or a module for performing remote control related to autonomous driving.

The 5G network may transmit information (or signal) related to the remote control to an autonomous vehicle (S3).

As described above, information related to the remote control may be a signal directly applied to the autonomous vehicle, and may further include service information necessary for autonomous driving. The autonomous vehicle according to this embodiment may receive service information such as insurance for each interval selected on a driving route and risk interval information, through a server connected to the 5G network to provide services related to autonomous driving.

An essential process for performing 5G communication between the autonomous vehicle 200 and the 5G network (for example, an initial access process between the vehicle and the 5G network) will be briefly described with reference to FIG. 5 to FIG. 9 below.

An example of application operations through the autonomous vehicle 200 performed in the 5G communication system and the 5G network is as follows.

The vehicle 200 may perform an initial access process with the 5G network (initial access step, S20). In this case, the initial access procedure includes a cell search process for acquiring downlink (DL) synchronization and a process for acquiring system information.

The vehicle 200 may perform a random access process with the 5G network (random access step, S21). At this time, the random access procedure includes an uplink (UL) synchronization acquisition process or a preamble transmission process for UL data transmission, a random access response reception process, and the like.

The 5G network may transmit an uplink (UL) grant for scheduling transmission of specific information to the autonomous vehicle 200 (UL grant receiving step, S22).

The procedure by which the vehicle 1000 receives the UL grant includes a scheduling process in which a time/frequency resource is allocated for transmission of UL data to the 5G network.

The autonomous vehicle 200 may transmit specific information over the 5G network based on the UL grant (specific information transmission step, S23).

The 5G network may determine whether the vehicle 200 is to be remotely controlled based on the specific information transmitted from the vehicle 200 (vehicle remote control determination step, S24).

The autonomous vehicle 200 may receive the DL grant through a physical DL control channel for receiving a response on pre-transmitted specific information from the 5G network (DL grant receiving step, S25).

The 5G network may transmit information (or signal) related to the remote control to the autonomous vehicle 200 based on the DL grant (remote control related information transmission step, S26).

A process in which the initial access process and/or the random access process between the 5G network and the autonomous vehicle 200 is combined with the DL grant receiving process has been exemplified. However, the present disclosure is not limited thereto.

For example, an initial access procedure and/or a random access procedure may be performed through an initial access step, an UL grant reception step, a specific information transmission step, a remote control decision step of the vehicle, and an information transmission step associated with remote control. Further, an initial access procedure and/or a random access procedure may be performed through a random access step, an UL grant reception step, a specific information transmission step, a remote control decision step of the vehicle, and an information transmission step associated with remote control. The autonomous vehicle 200 may be controlled by the combination of an AI operation and the DL grant receiving process through the specific information transmission step, the vehicle remote control determination step, the DL grant receiving step, and the remote control related information transmission step.

The operation of the autonomous vehicle 200 described above is merely exemplary, and the present disclosure is not limited thereto.

For example, the operation of the autonomous vehicle 200 may be performed by selectively combining the initial access step, the random access step, the UL grant receiving step, or the DL grant receiving step with the specific information transmission step, or the remote control related information transmission step. The operation of the autonomous vehicle 200 may include the random access step, the UL grant receiving step, the specific information transmission step, and the remote control related information transmission step. The operation of the autonomous vehicle 200 may include the initial access step, the random access step, the specific information transmission step, and the remote control related information transmission step. The operation of the autonomous vehicle 200 may include the UL grant receiving step, the specific information transmission step, the DL grant receiving step, and the remote control related information transmission step.

Figure 6:
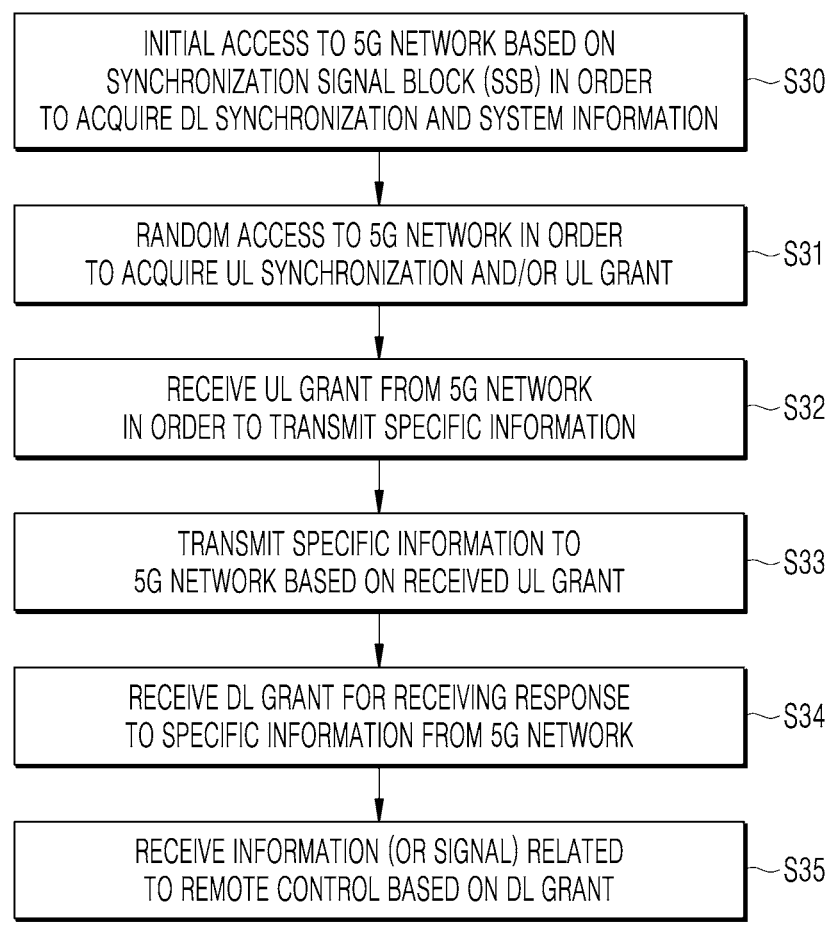
FIGS. 6 to 9 are diagrams showing an example of the operation of an autonomous vehicle using a 5G communication.

As illustrated in FIG. 6, the vehicle 200 including an autonomous driving module may perform an initial access process with the 5G network based on Synchronization Signal Block (SSB) for acquiring DL synchronization and system information (initial access step, S30).

The autonomous vehicle 200 may perform a random access process with the 5G network for UL synchronization acquisition and/or UL transmission (random access step, S31).

The autonomous vehicle 200 may receive the UL grant from the 5G network for transmitting specific information (UL grant receiving step, S32).

The autonomous vehicle 200 may transmit the specific information to the 5G network based on the UL grant (specific information transmission step, S33).

The autonomous vehicle 200 may receive the DL grant from the 5G network for receiving a response to the specific information (DL grant receiving step, S34).

The autonomous vehicle 200 may receive remote control related information (or signal) from the 5G network based on the DL grant (remote control related information receiving step, S35).

A beam management (BM) process may be added to the initial access step, and a beam failure recovery process associated with Physical Random Access Channel (PRACH) transmission may be added to the random access step. QCL (Quasi Co-Located) relation may be added with respect to the beam reception direction of a Physical Downlink Control Channel (PDCCH) including the UL grant in the UL grant receiving step, and QCL relation may be added with respect to the beam transmission direction of the Physical Uplink Control Channel (PUCCH)/Physical Uplink Shared Channel (PUSCH) including specific information in the specific information transmission step. Further, a QCL relationship may be added to the DL grant reception step with respect to the beam receiving direction of the PDCCH including the DL grant.

Figure 7:
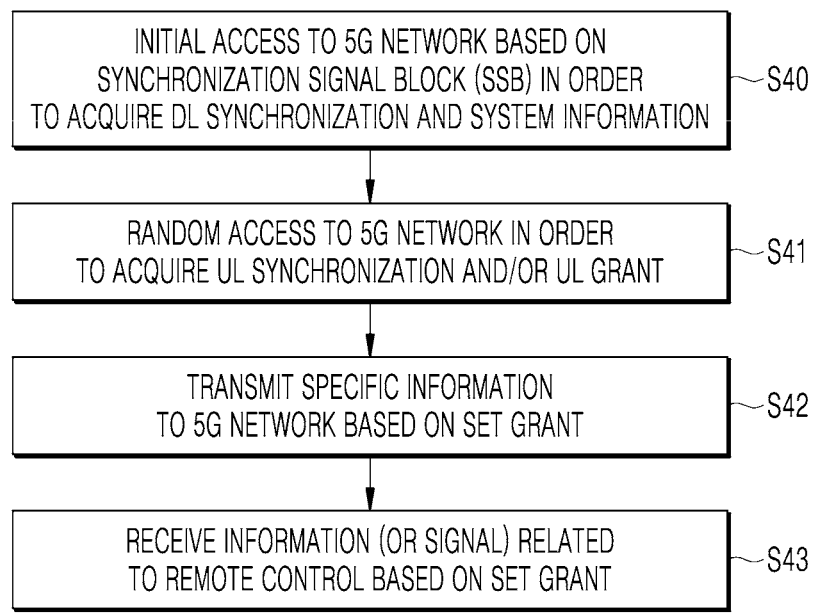

As illustrated in FIG. 7, the autonomous vehicle 200 may perform an initial access process with the 5G network based on SSB for acquiring DL synchronization and system information (initial access step, S40).

The autonomous vehicle 200 may perform a random access process with the 5G network for UL synchronization acquisition and/or UL transmission (random access step, S41).

The autonomous vehicle 200 may transmit specific information based on a configured grant to the 5G network (UL grant receiving step, S42). In other words, instead of receiving the UL grant from the 5G network, the configured grant may be received.

The autonomous vehicle 200 may receive the remote control related information (or signal) from the 5G network based on the configured grant (remote control related information receiving step, S43).

Figure 8:
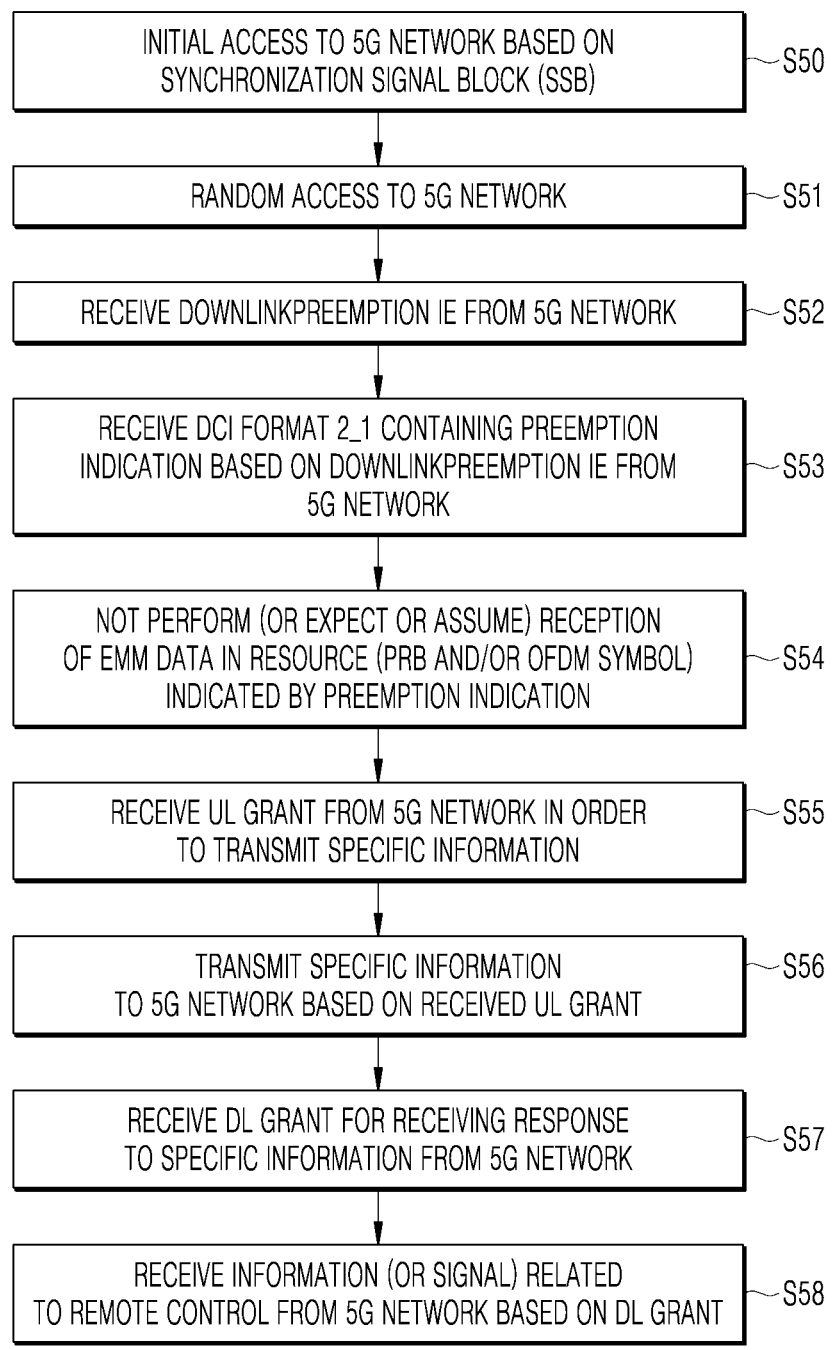

As illustrated in FIG. 8, the autonomous vehicle 200 may perform an initial access process with the 5G network based on SSB for acquiring DL synchronization and system information (initial access step, S50).

The autonomous vehicle 200 may perform a random access process with the 5G network for UL synchronization acquisition and/or UL transmission (random access step, S51).

In addition, the autonomous vehicle 200 may receive Downlink Preemption (DL) and Information Element (IE) from the 5G network (DL Preemption IE reception step, S52).

The autonomous vehicle 200 may receive DCI (Downlink Control Information) format 2_1 including preemption indication based on the DL preemption IE from the 5G network (DCI format 2_1 receiving step, S53).

The autonomous vehicle 200 may not perform (or expect or assume) the reception of eMBB data in the resource (PRB and/or OFDM symbol) indicated by the pre-emption indication (step of not receiving eMBB data, S54).

The autonomous vehicle 200 may receive the UL grant over the 5G network for transmitting specific information (UL grant receiving step, S55).

The autonomous vehicle 200 may transmit the specific information to the 5G network based on the UL grant (specific information transmission step, S56).

The autonomous vehicle 200 may receive the DL grant from the 5G network for receiving a response to the specific information (DL grant receiving step, S57).

The autonomous vehicle 200 may receive the remote control related information (or signal) from the 5G network based on the DL grant (remote control related information receiving step, S58).

Figure 9:
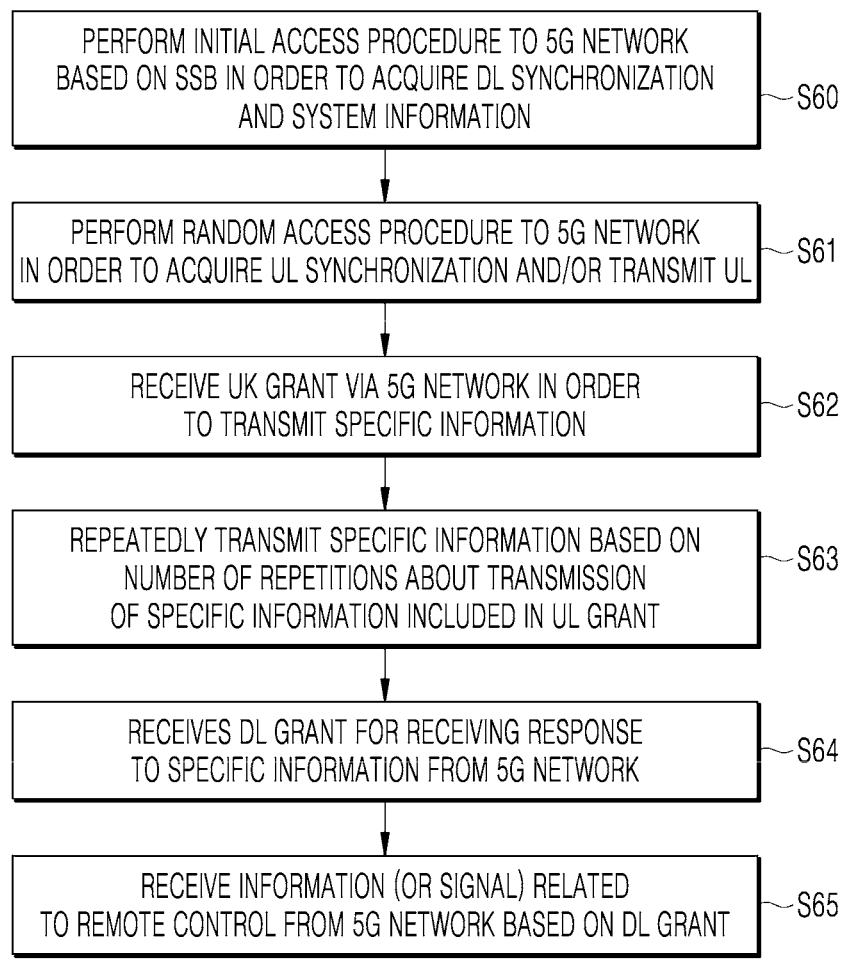

As illustrated in FIG. 9, the autonomous vehicle 200 may perform an initial access process with the 5G network based on SSB for acquiring DL synchronization and system information (initial access step, S60).

The autonomous vehicle 200 may perform a random access process with the 5G network for UL synchronization acquisition and/or UL transmission (random access step, S61).

The autonomous vehicle 200 may receive the UL grant over the 5G network for transmitting specific information (UL grant receiving step, S62).

When specific information is transmitted repeatedly, the UL grant may include information on the number of repetitions, and the specific information may be repeatedly transmitted based on information on the number of repetitions (specific information repetition transmission step, S63).

The autonomous vehicle 200 may transmit the specific information to the 5G network based on the UL grant.

Also, the repetitive transmission of specific information may be performed through frequency hopping, the first specific information may be transmitted in the first frequency resource, and the second specific information may be transmitted in the second frequency resource.

The specific information may be transmitted through Narrowband of 6 Resource Block (6RB) and 1 Resource Block (1RB).

The autonomous vehicle 200 may receive the DL grant from the 5G network for receiving a response to the specific information (DL grant receiving step, S64).

The autonomous vehicle 200 may receive the remote control related information (or signal) from the 5G network based on the DL grant (remote control related information receiving step, S65).

The above-described 5G communication technique can be applied in combination with the embodiment proposed in this specification, which will be described in FIG. 1 to FIG. 14, or supplemented to specify or clarify the technical feature of the embodiment proposed in this specification.

A display 121 of the user interface 120 may display an operation state of the acoustic control system 1 under the control of the controller 160. According to an embodiment, the display 121 may form a layered structure with a touch pad so as to be configured as a touch screen. In this case, the display 121 may also be used as a manipulation interface 122 capable of inputting information in response to a touch of a user. To this end, the display 121 may be configured with a touch-sensitive display controller or other various input and output controllers. As an example, the touch recognition display controller may provide an output interface and an input interface between the device and the user. The touch recognition display controller may transmit and receive electrical signals with the controller 160. Also, the touch recognition display controller may display a visual output to the user, and the visual output may include text, graphics, images, video, and a combination thereof.

The manipulation interface 122 of the user interface 120 may have a plurality of manipulation buttons (not shown), and signals corresponding to inputted buttons may be transmitted the controller 160. This control interface 122 may be configured with a sensor, button, or switch structure capable of recognizing a touch or pressing operation of the user. In the present embodiment, the manipulation interface 122 may transmit, to the controller 160, manipulation signals, which are manipulated by the user in order to check or change various information related to the operation of the acoustic control system 1 displayed on the display 121.

Meanwhile, the user interface 120 may be included in the above-described vehicle user interface module or may include a vehicle user interface, and the display 121 may be included in an output module of the vehicle user interface module or may include an output module. In addition, the manipulation interface 122 may be included in an input module of the vehicle user interface module or may include an input module.

The audio input interface 131 of the audio processor 130 may collect in-vehicle acoustic signals generated in the travelling vehicle. For example, the audio input interface 131 may collect in-vehicle acoustic signals such as a sound outputted from the speaker 3, a sound generated inside the vehicle, a sound generated outside the vehicle, a sound including speech of a user, and a sound including speech of a passenger other than the user, through the microphone 2. Also, in the present embodiment, the audio input interface 131 may receive a spoken utterance of a user and transmit the spoken utterance to the controller 160, and the controller 160 may transmit the spoken utterance to the sound processor 140. To this end, the audio input interface 131 may include one or more microphones 2. In order to more accurately receive the spoken utterance of the user, a plurality of the microphones 2 may also be used. Here, each of the plurality of microphones may be disposed at different positions, and the collected sounds may be processed as electrical signals.

Meanwhile, the audio input interface 131 may use various echo cancellation algorithms for removing echoes generated in the process of collecting acoustic signals in the vehicle generated in the travelling vehicle. Also, in the present embodiment, as an optional embodiment, the audio input interface 131 may use various echo cancellation algorithms for removing echoes generated in the process of receiving a spoken utterance of a user. That is, in the present embodiment, the output acoustic signal inputted to the speaker to be outputted through the speaker may be removed from the acoustic signals in the vehicle collected through the microphone.

Figure 10:
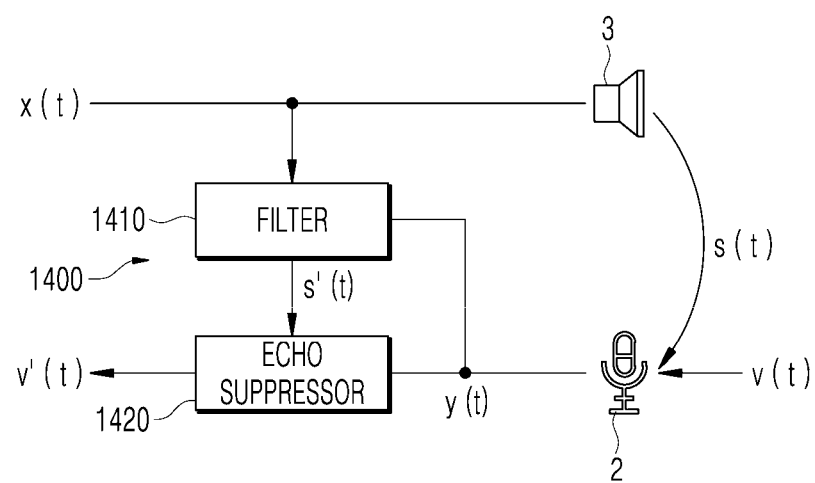
FIG. 10 is a schematic block diagram illustrating an echo canceler of an acoustic control system according to an embodiment of the present disclosure.

FIG. 10 is a schematic block diagram illustrating an echo canceler of an acoustic control system according to an embodiment of the present disclosure.

Referring to FIG. 10, an echo canceler (or acoustic echo canceler) 1400 may include a filter 1410 and an echo suppressor 1420. Referring to FIG. 10 in more detail, an audio output signal x(t) provided from the audio system of the vehicle is outputted through the speaker 3, and may be provided to the user. In addition, the microphone 2 may receive an audio input signal y(t). Although not shown, the audio output signal x(t) may be converted from digital to analog and outputted through the speaker 3, and the audio input signal y(t) may be converted from analog to digital after it is received from the microphone 2.

The audio input signal y(t) received by the microphone 2 may include a near-end signal v(t) and an echo signal s(t). The near-end signal v(t) is a signal which the user intends to be received by the microphone 2, and may also be referred to as a desired signal or a primary signal. The echo signal s(t) is a signal representing an echo component generated by the output from the speaker 3. Although not shown, the audio input signal y(t) may further include noise. The echo component and the noise act as interference to the near-end signal v(t), and need to be removed or suppressed. In one embodiment, algorithms such as doubletalk detection and step-size control may be used to perform echo cancellation.

The filter 1410 may estimate an echo signal s(t) included in the audio input signal y(t) based on the audio output signal x(t) and the audio input signal y(t), to thereby generate an estimated echo signal s'(t). In other words, the filter 1410 may model the echo component within the audio input signal y(t) and the echo path that causes the echo component, and estimate how the echo path changes a part of the audio output signal x(t) to the echo component. The audio output signal x(t) may be used as a reference signal.

The echo path represents the effect of an acoustic path through which a far-end signal travels from the speaker 3 to the microphone 2. The far-end signal may travel directly from the speaker 3 to the microphone 2, or may be reflected from various surfaces of the external environment. The echo path through which the far-end signal outputted from the speaker 3 passes may be regarded as a system having a frequency and phase response that may change over time.

In one embodiment, the echo path may be modeled using any linear filter (for example, a finite impulse response (FIR) filter or an infinite impulse response (IIR) filter). For example, the estimate of the echo path may be a vector having (N+1) values (where N is a natural number), and the filter 1410 may be implemented as an N-th filter having a finite length of time. In one embodiment, the estimate of the echo path need not be calculated explicitly, and may be expressed as a filter coefficient obtained from stochastic gradient algorithms such as least mean squares (LMS), normalized least mean squares (NLMS), fast affine projection (FAP), and recursive least squares (RLS). In one embodiment, the estimate of the echo path may be updated continuously over time.

The echo suppressor 1420 may generate an estimated near-end signal v'(t) based on the estimated echo signal s'(t) and the audio input signal y(t). For example, the echo suppressor 1420 may apply echo suppression to the audio input signal y(t) based on the estimated echo signal s'(t) to thereby generate the estimated near-end signal v'(t). The more accurately the echo path is estimated, the closer the estimated near-end signal v'(t) may become to the near-end signal v(t). In one embodiment, the echo suppressor 1420 may be implemented in the form of an echo subtractor. For example, the echo subtractor may generate an estimated near-end signal v'(t) by subtracting the estimated echo signal s'(t) from the audio input signal y(t). Specific embodiments of the above respective components of the echo suppressor 1420 may be implemented in various ways by those skilled in the art, and some components may be omitted/added or replaced with other components within the scope of the embodiments of the present disclosure.

The audio output interface 132 of the audio processor 130 may output an acoustic service (for example, music, a navigation, a warning message according to control of the controller 160, notification message regarding an operation mode, an operation status, and an error status, response information corresponding to the user's utterance information, and a processing result corresponding to a spoken utterance of the user (voice command)). Herein, the audio output interface 132 can convert an electrical signal from the controller 160 into an audio signal, and output the audio signal. In particular, in the present embodiment, the audio output interface 132 may output, through the speaker 3, the output acoustic signals in which the volume and the equalizer settings have been adjusted in response to the analysis result of the in-vehicle acoustic signals from the controller 160.

In this embodiment, the sound processor 140 may perform learning in association with the controller 160, or may receive a learning result from the controller 160. In the present embodiment, the sound processor 140 may be provided outside the controller 160, may be provided inside the controller 160 to operate like the controller 160 as shown in FIG. 3, or may be provided inside the server 300 of FIG. 2. Hereinafter, the details of the sound processor 140 will be described with reference to FIG. 11.

The memory 150 may store various kinds of information necessary for the operation of the acoustic control system 1, and may include a volatile or nonvolatile recording medium. For example, the memory 150 may store sound patterns for analyzing in-vehicle acoustic signals collected from the audio input interface 131, volume sizes and equalizer setting data corresponding to the types of acoustic signals, and user setting data. In addition, the memory 150 may include an event pattern learning model for analyzing an in-vehicle acoustic signal received through the audio input interface 131. The memory 150 may store a spoken utterance of the user received through the audio input interface 131, store information processed by the sound processor 140, and store a user-voice actor mapping learning model for speech recognition. In this case, the user-voice actor mapping learning model may refer to a deep neural network model for voice discrimination. In the present embodiment, before the step of collecting the in-vehicle acoustic signal, the spoken utterance of the user of the vehicle may be registered through the microphone, and the deep neural network model (the user-voice actor mapping learning model) for speech discrimination may be trained with the spoken utterances of the user to thereby generate a deep neural network model (user-voice actor mapping learning model) capable of discriminating a spoken utterance of the user.

Here, the memory 150 may include magnetic storage media or flash storage media, but the scope of the present disclosure is not limited thereto. The memory 150 as described above may include magnetic storage media or flash storage media, but the scope of the present disclosure is not limited thereto. This memory 150 may include an internal memory and an external memory, and may include: a volatile memory such as a DRAM, SRAM, or SDRAM; a non-volatile memory such as a one time programmable ROM (OTPROM), PROM, EPROM, EEPROM, mask ROM, flash ROM, NAND flash memory, or NOR flash memory; and a storage device such as an HDD or a flash drive such as an SSD, compact flash (CF) card, SD card, micro-SD card, mini-SD card, XD card, or a memory stick.

The controller 160 may analyze the in-vehicle acoustic signals collected through the microphone 2, and adjust the volume of the output acoustic signal outputted through the speaker 3 in response to the analysis result of the in-vehicle acoustic signals and the setting of the equalizer. In this case, the controller 160 may analyze the in-vehicle acoustic signal based on, for example, a pre-trained deep neural network model to determine whether the acoustic signal is normal noise or abnormal noise, and adjust the volume of the output acoustic signal and the equalizer.

In addition, the controller 160 may transmit the spoken utterance of the user received through the audio input interface 131 to the sound processor 140, and may provide a speech recognition processing result from the sound processor 140 as visual information through the display 121, or as audio information through the audio output interface 132.

The controller 160 can control the entire operation of the acoustic control system by driving control software installed in the memory 181 as a kind of central processor. The controller 160 may include any type of device capable of processing data, such as a processor. Here, the term "processor" may refer to a data processing device built in hardware, which includes physically structured circuits in order to perform functions represented as a code or command present in a program. Examples of the data processing device built in hardware may include microprocessors, central processors (CPUs), processor cores, multiprocessors, application-specific integrated circuits (ASICs), digital signal processors (DSPs), digital signal processing devices (DSPDs), programmable logic devices (PLDs), processors, controllers, micro-controllers, and field programmable gate array (FPGA), but the present disclosure is not limited thereto.

In the present embodiment, in order for the acoustic control system 1 to be able to perform optimal acoustic control, the controller 160 may perform machine learning such as deep learning for, for example, determination of the type of the acoustic signal of the acoustic control system 1, analysis of the event pattern, adjustment of the volume and equalizer setting according to the type of the acoustic signal, adjustment of the volume and equalizer setting according to the event pattern, estimation of noise generated inside the vehicle during the vehicle driving operation according to the vehicle model, acquisition of a voice command, and operation of the acoustic control system 1 corresponding to the voice command and a user-customized operation. The memory 150 may store data such as data used for machine learning and result data.

Deep learning, which is a subfield of machine learning, enables data-based learning through multiple layers. Deep learning may represent a set of machine learning algorithms that extract core data from a plurality of data sets as the number of layers increases.

Deep learning structures may include an artificial neural network (ANN).

For example, the deep learning structure may include a deep neural network (DNN), such as a convolutional neural network (CNN), a recurrent neural network (RNN), and a deep belief network (DBN). In the present embodiment, the deep learning structure may use a variety of structures well known to those skilled in the art. For example, the deep learning structure according to the present disclosure may include a CNN, a RNN, and a DBN. The RNN is widely used in natural language processing, and can be effectively used to process time-series data that changes over time, and may construct an ANN structure by progressively extracting higher level features through multiple layers. The DBN may include a deep learning structure that is constructed by stacking the result of restricted Boltzman machine (RBM) learning in multiple layers. When a predetermined number of layers are constructed by repetition of such RBM learning, the DBN provided with the predetermined number of layers can be constructed. A CNN includes a model mimicking a human brain function, built under the assumption that when a person recognizes an object, the brain extracts the most basic features of the object and recognizes the object based on the results of complex processing in the brain.

Further, the artificial neural network may be trained by adjusting weights of connections between nodes (if necessary, adjusting bias values as well) so as to produce a desired output from a given input. Furthermore, the artificial neural network may continuously update the weight values through training. Furthermore, a method of back propagation or the like may be used in the learning of the artificial neural network.

That is, an artificial neural network may be installed in the acoustic control system 1, and the controller 160 may include an artificial neural network, for example, a deep neural network (DNN) such as a CNN, an RNN, and a DBN. Accordingly, the controller 160 may train a deep neural network for, for example, determination of the type of the acoustic signal, event pattern analysis, volume and equalizer setting adjustment according to the type of the acoustic signal, volume and equalizer setting adjustment according to the event pattern, estimation of noise which is generated inside the vehicle during the vehicle driving operation depending on the vehicle model, voice command acquisition, and operation of the acoustic control system 1 corresponding to the voice command and the user-customized operation. Machine learning of the artificial neural network may include unsupervised learning and supervised learning. The controller 160 may control so as to update an artificial neural network structure after learning according to a setting.

In this embodiment, parameters for pre-trained deep neural network learning may be collected. Here, the parameters for the deep neural network learning may include, for example, acoustic signal data in the vehicle collected from the microphone 2, output acoustic signal data outputted from the speaker 3, user voice data, volume and equalizer setting adjustment data according to the type of the acoustic signal in the vehicle, driving mode data of the vehicle, and noise information data according to the vehicle model. In addition, the parameters for deep neural network learning may include voice commands, motions of the acoustic control system 1 corresponding to the voice commands, and user-customized motion data. However, in the present embodiment, the parameters for deep neural network learning are not limited thereto. In the present embodiment, data used by an actual user may be collected in order to refine the learning model. That is, in the present embodiment, the user data may be inputted from the user through the transceiver 110 and the vehicle user interface 120. In the present embodiment, when the user data is received from the user, input data may be stored in the server and/or the memory regardless of the result of the learning model. That is, in the present embodiment, the acoustic control system 1 may save data for acoustic control to configure big data when using in-vehicle acoustic system, and may update the related parameters by executing the deep learning in the server so that the parameters become more elaborate. However, in the present embodiment, the update may be performed by executing deep learning in the acoustic control system or the edge of the vehicle. In other words, in the present embodiment, laboratory condition deep learning parameters are built into the vehicle at the time of initial setting of the acoustic control system or initial release of the vehicle, and as the user drives the vehicle, that is, as the user uses the acoustic system of the vehicle, the update may be performed through accumulated data. Therefore, in the present embodiment, the collected data may be labeled to obtain a result through map learning, and stored in the memory 150 of the acoustic control system itself to thereby complete an evolving algorithm. That is, the acoustic control system may collect data for sound control to generate a training data set, and may train a model using the training data set through a machine learning algorithm to thereby determine a trained model. In addition, the acoustic control system may collect data used by an actual user and perform re-training in the server to thereby generate a re-trained model. Therefore, in the present embodiment, even after being determined as a trained model, data may be continuously collected, and the model may be re-trained by applying a machine learning model, to thereby improve the performance as a re-trained model.

Figure 11:
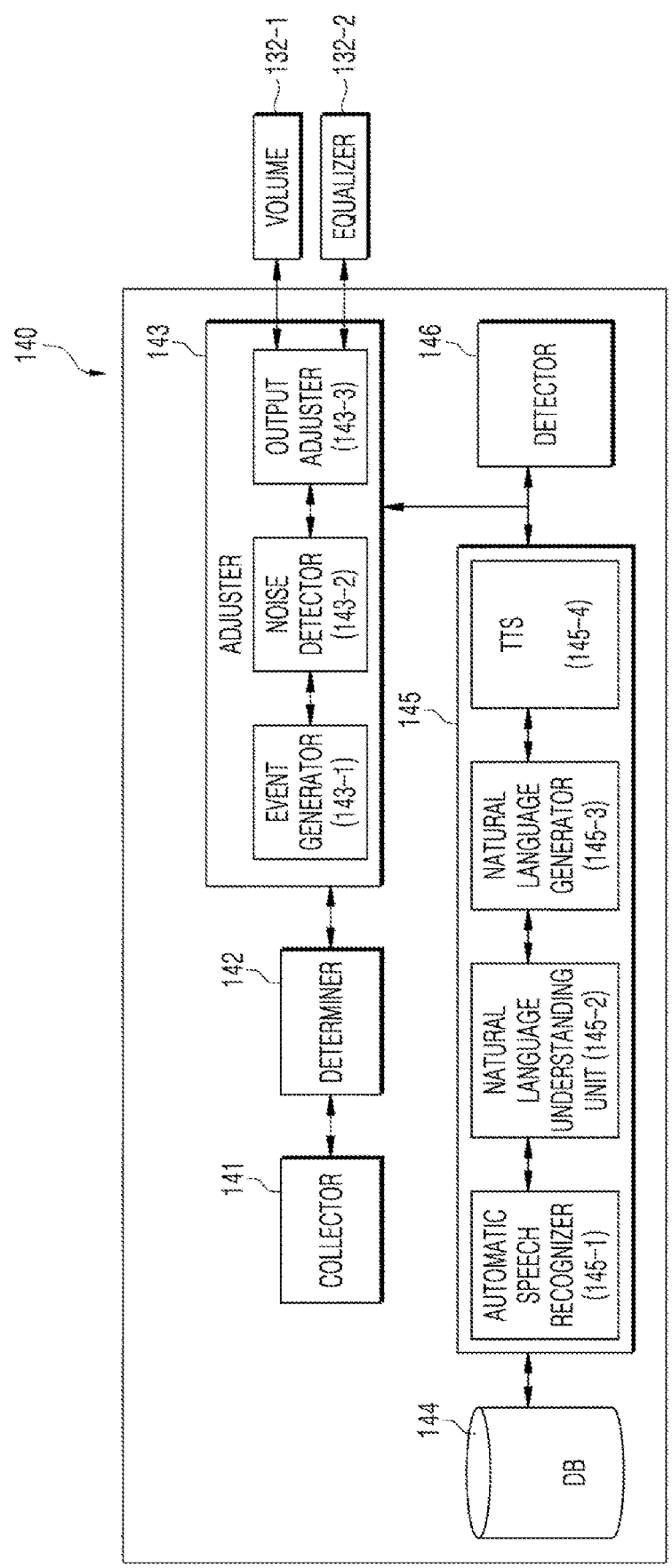
FIG. 11 is a schematic block diagram of a sound processor of an acoustic control system according to an embodiment of the present disclosure.

FIG. 11 is a schematic block diagram of a sound processor of an acoustic control system according to an embodiment of the present disclosure. In the following description, description of parts that are the same as those in FIG. 1 to FIG. 10 will be omitted.

Referring to FIG. 11, the sound processor 140 may include a collector 141, a determiner 142, an adjuster 143, a database (DB) 144, a speech recognizer 145, and a detector 146.

The collector 141 may collect acoustic signals in the vehicle through one or more microphones 2 provided in the travelling vehicle. That is, the collector 141 may collect acoustic signals in the vehicle, inputted through the audio input interface 131. In this case, the acoustic signal in the vehicle may include, for example, a sound outputted from the speaker 3, a sound generated inside the vehicle, a sound generated outside the vehicle, a spoken utterance of the user, and a sound including speech of another passenger.

The determiner 142 may analyze the acoustic signal in the vehicle collected by the collector 141. In this case, the determiner 142 may analyze the features of the in-vehicle acoustic signal and analyze the feature vector of the in-vehicle acoustic signal to thereby determine whether the acoustic signal is normal noise or abnormal noise. In addition, the determiner 142 may analyze the features of the acoustic signal and use a first deep neural network model that has been trained to determine whether the acoustic signal is normal noise or abnormal noise generated in the vehicle to determine whether the noise in the vehicle is abnormal or abnormal. In this case, the first deep neural network model may be trained through training data in which big data on sounds normally generated in a vehicle is labeled as normal noise. Hereinafter, the determiner 142 will be described in more detail with reference to FIG. 12.

Figure 12:
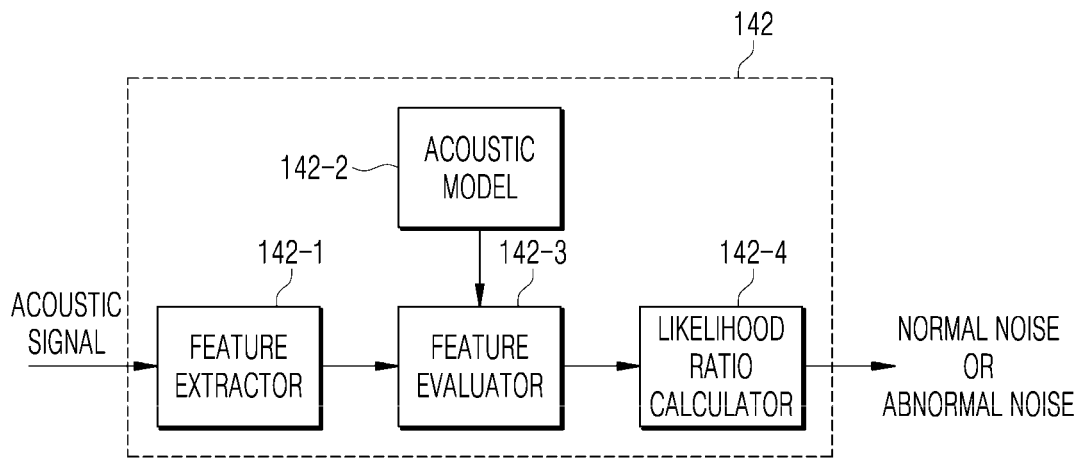
FIG. 12 is a schematic block diagram of a determiner of an acoustic control system according to an embodiment of the present disclosure.

FIG. 12 is a schematic block diagram of a determiner of an acoustic control system according to an embodiment of the present disclosure.

Referring to FIG. 12, the determiner 142 may determine whether the type of the in-vehicle acoustic signal is normal or abnormal through analysis of the in-vehicle acoustic signals collected by the collector 141. That is, in this embodiment, the in-vehicle acoustic signal may be classified into normal noise or abnormal noise. In this embodiment, normal noise may refer to sounds that are normally generated in a vehicle. The normal noise may refer to, for example, a speech event such as speech of a user, or a conversation or phone call between the user and another passenger. That is, the normal noise may include human speech. In addition, the normal noise may include not only a speech event but also a speech recognition service and an acoustic service that are determined to be regularly occurring sounds. For example, the acoustic service may include sounds from an entertainment system such as sounds from a user's directly inputted or selected music or radio, and sounds from a vehicle driving support system such as navigation and warning sounds. Also, in the present embodiment, as an optional embodiment, the sound of a previously stored pattern may be classified as normal noise. Here, the sound of the previously stored pattern may include, for example, a baby's cry and a horn sound generated for a predetermined time or more within a predetermined distance outside the vehicle.

Abnormal noise may refer to a one-off acoustic signal that is not normally generated during driving of a vehicle, excluding human speech. For example, the abnormal noise may include external environmental noise such as driving noise and construction noise generated outside the vehicle during driving.

In the present embodiment, the determiner 142 may classify and recognize acoustic events including normal noise and abnormal noise that may be generated in a vehicle in a hierarchical manner, thereby enabling effective contextual awareness. The determiner 142 may analyze acoustic features extracted from the inputted acoustic signal, and may hierarchically recognize and classify the event of the acoustic signal. Here, the event may indicate the type of acoustic signal such as human speech, music, and driving noise.

The determiner 142 may include a feature extractor 142-1, an acoustic model 142-2, a feature evaluator 142-3, and a likelihood ratio calculator 142-4.

The feature extractor 142-1 may extract an acoustic feature from an inputted acoustic signal. The inputted acoustic signal may be, for example, a sound frame of 50 ms units, and the feature extractor 142-1 may extract the sound feature from the sound frame. The acoustic feature may include a Mel-Frequency Cepstral Coefficient (MFCC) feature and a timbre feature. The feature extractor 142-1 may perform MFCC feature and timbre feature extraction in sequence or in parallel. The MFCC feature may be utilized in speech recognition and acoustic context awareness with the feature vector which is extracted in more detail in a low frequency region compared to a high frequency region by reflecting a human hearing characteristic which is relatively sensitive to change in the low frequency region. The feature extractor 142-1 may pre-process the acoustic signal of the time region to boost high frequency energy, apply fast Fourier transform (FFT) to obtain the spectrum of the frequency region, make the obtained spectrum correspond to a triangular filter bank fitting the Mel scale to obtain the sum of the sizes at respective bands, take the log of the filter bank output value, and then obtain the MFCC characteristic vector by discrete cosine transform. The MFCC feature may be used by combining the MFCC feature and the Delta feature, which is an amount of the MFCC changed according to time (hereinafter, collectively referred to as "MFCC feature"). The feature extraction process is a known technology, and a detailed description thereof will be omitted.

The acoustic model 142-2 is a database of reference acoustic features, and may include, for example, a reference MFCC feature and a reference timbre feature. The reference timbre feature is a timbre feature extracted from a training acoustic database. The reference MFCC feature is an acoustic event model modeled by sufficiently updating the mean, the covariance matrix, and the weight of a Gaussian Mixture Model (GMM) using the MFCC feature extracted from a training acoustic database. That is, the acoustic model 142-2 may be trained on acoustic signals that may be generated in a vehicle, and then modeled using the GMM.

The feature evaluator 142-3 may evaluate the acoustic feature by calculating a similarity between the acoustic feature of the acoustic signal and the reference acoustic feature. The reference acoustic feature is a feature previously obtained by training for a defined plurality of acoustic events. The acoustic event may include a plurality of speech events and a plurality of non-speech events.

The likelihood ratio calculator 142-4 may extract the feature of the acoustic signal inputted from the collector 141, and then compare the feature with a pre-trained acoustic model 142-2 and perform analysis to thereby determine the type of the acoustic signal (normal noise or abnormal noise). In this embodiment, the likelihood ratio calculator 142-4 may perform noise verification using a statistical model method based on GMM. When using the statistical model scheme based on the GMM, when an acoustic signal for verification is inputted, the likelihood ratio calculator 142-4 calculates the likelihood ratio between a normal noise GMM model and a universal background model (UBM) GMM model, and if the likelihood ratio is greater than a threshold, the likelihood ratio calculator 142-4 accepts the inputted acoustic signal as normal noise, and, in other cases, the likelihood ratio calculator 142-4 rejects the acoustic signal. Here, the normal noise GMM model is a statistical model of acoustic signals that may be classified as normal noise which become a subject of verification by GMM, and the universal background model GMM model is a statistical model of various unspecific acoustic signals by GMM. The likelihood ratio is the ratio between the stochastic similarity of the normal noise GMM model and the stochastic similarity of the universal background model GMM model.

Also, in the present embodiment, the likelihood ratio calculator 142-4 may, based on a speaker verification algorithm, verify whether an acoustic signal inputted from the collector 141 is a claimed speaker, that is, whether the acoustic signal inputted from the collector 141 is a spoken utterance of the user. That is, the speaker verification algorithm is an algorithm that automatically verifies whether the inputted voice is the voice of the claimed speaker, and can be usefully used in various fields such as security or forensic fields. In this embodiment, the likelihood ratio calculator 142-4 may perform speaker verification using a statistical model method based on GMM. When using the statistical model method based on the GMM, when an acoustic signal for verification is inputted, the likelihood ratio calculator 142-4 calculates the likelihood ratio between a claimed speaker GMM model and the universal background model (UBM) GMM model, and if the likelihood ratio is greater than a threshold, the likelihood ratio calculator 142-4 accepts the inputted acoustic signal as speech of the claimed speaker, and, in other cases, the likelihood ratio calculator 142-4 rejects the acoustic signal. Here, the claimed speaker GMM model is a statistical model of the speaker's unique speech to be verified by GMM, and the universal background model GMM model is generated by statistically modeling various spoken utterances of unspecified people by GMM. The likelihood ratio is the ratio between the stochastic similarity of the claimed speaker GMM model and the stochastic similarity of the universal background model GMM model.

That is, the determiner 142 may classify the acoustic signal as one of a plurality of acoustic events by a hierarchical approach method, based on the similarity between the acoustic feature of the acoustic signal and the reference acoustic feature. Generally, a sound can be divided into two main categories: a vocal (speech) sound, which is a sound generated from a human throat; and a non-vocal (non-speech) sound, which is a sound other than the vocal sound. For example, speech sounds may be classified into events such as conversation, music, crying, and announcements. Non-speech sounds may be classified into events other than speech that may occur in a vehicle, such as driving noise. Speech and non-speech events are not limited to the above-described types, and can be variously set according to the monitoring area and the system design. The determiner 142 may include a plurality of classifiers for determining the type of an acoustic signal. Each classifier can use optimized acoustic features, can be reconfigured according to the system installation environment, can be applied to various locations according to the classifier configuration, and can be subdivided into various events even within the non-speech type.

That is, the determiner 142 may first classify an acoustic signal into a speech signal or a non-speech signal. Thereafter, when the acoustic signal is a speech signal, the acoustic signal may be classified as an event of normal noise, and when the acoustic signal is a non-speech signal, the acoustic signal may be classified as an event of abnormal noise. At this time, the determiner 142 may reclassify, as normal noise, the output acoustic signal outputted from the speaker in the vehicle and the sound of the pre-stored pattern among the non-audio acoustic signals classified as abnormal noise.

The adjuster 143 may adjust the volume of the acoustic signal outputted through the speaker 3 provided in the vehicle and the setting of the equalizer, in response to the acoustic signal in the vehicle analyzed by the determiner 142. The adjuster 143 may include an event generator 143-1, a noise detector 143-2, and an output adjuster 143-3. That is, the event generator 143-1 of the adjuster 143 may generate an event signal corresponding to the type of the acoustic signal, and the noise detector 143-2 may detect noise in response to the event signal generated in the event generator 143-1. The output adjuster 143-3 of the adjuster 143 may adjust the settings of the volume 132-1 and an equalizer 132-2 of the audio output interface 132 according to the noise size and waveform based on the detected noise.

The event generator 143-1 may generate an acoustic event signal corresponding to the analysis result of the in-vehicle acoustic signal based on the result of analyzing the in-vehicle acoustic signal. In the present embodiment, as a result of analyzing the acoustic signal in the vehicle, when the acoustic signal is normal noise including a spoken utterance of a user, the event generator 143-1 may generate a first acoustic event signal. Here, as a result of analyzing the acoustic signal in the vehicle using the first deep neural network model (noise determination model) and a second deep neural network model (speech determination model), when the acoustic signal in the vehicle is normal noise that includes the spoken utterance of the user, the event generator 143-1 may generate the first acoustic event signal. Further, as a result of analyzing the acoustic signal in the vehicle, when the acoustic signal in the vehicle is normal noise including the spoken utterance of the user and spoken utterance of another passenger, the event generator 143-1 may generate a second acoustic event signal. Here, as a result of analyzing the acoustic signal in the vehicle using the first deep neural network model and the second deep neural network model, when the acoustic signal in the vehicle is normal noise that includes the spoken utterance of the user and the spoken utterance of another passenger, the event generator 143-1 may generate a second acoustic event signal. In addition, as an alternative embodiment, as a result of analyzing the acoustic signal in the vehicle, even when the acoustic signal in the vehicle is normal noise including a sound of a previously stored pattern, the event generator 143-1 may also generate a second acoustic event signal.

Here, the sound of the pre-stored pattern may include, for example, a baby's cry. In addition, as a result of analyzing the acoustic signal, when the noise is normal noise including a spoken utterance of another passenger other than the user, the event generator 143-1 may generate a third sound event signal. Here, as a result of analyzing the acoustic signal in the vehicle using the first deep neural network model and the second deep neural network model, when the acoustic signal in the vehicle is normal noise that includes the spoken utterance of another passenger other than the user, the event generator 143-1 may generate the third acoustic event signal. When the acoustic signal in the vehicle is normal noise including an acoustic service being outputted through a speaker 3 in a travelling vehicle, the event generator 143-1 may generate a fourth acoustic event signal. In this case, as a result of analyzing the acoustic signal in the vehicle using the first deep neural network model, when the acoustic signal is normal noise including the acoustic service, the event generator 143-1 may generate the fourth acoustic event signal. In addition, as a result of analyzing the acoustic signal, when the acoustic signal is abnormal noise including external environmental noise generated in the travelling vehicle, the event generator 143-1 may generate a fifth acoustic event signal. In this case, as a result of analyzing the acoustic signal in the vehicle using the first deep neural network model, when the acoustic signal is abnormal noise including external environmental noise generated in the vehicle, the event generator 143-1 may generate the fifth acoustic event signal. Here, the external environmental noise may include, for example, noise from the outside of the vehicle.

The noise detector 143-2, with respect to normal noise, may estimate the noise by obtaining power, and analyze a frequency response. Since a method of estimating noise by obtaining power and analyzing a frequency response is well known, a detailed description thereof will be omitted here.

The output adjuster 143-3 may adjust settings of the volume 132-1 and the equalizer 132-2 of the output acoustic signal being outputted through the speaker 3 provided in the vehicle in response to the magnitude and the waveform of the noise. Here, the equalizer may refer to a device that selectively raises or attenuates a volume of a specific frequency, that is, an audible frequency band (20 Hz to 20 Khz), in an acoustic device. The equalizer may include a graphic equalizer and a digital parametric equalizer, depending on the purpose. The graphic equalizer has multiple frequency bands visually arranged from left to right, which can be adjusted by raising or lowering a volume slider. In addition, the digital parametric equalizer is applied to a full digital amplifier so that an internally inputted digital sound source can be adjusted according to the parameters using each filter. In general, in an audio device, an equalizer amplifier is a device having a function of raising or lowering the amplification of five to twelve frequencies between 16 Hz and 32 kHz. In other words, an equalizer may be used to create a sound according to the taste of a person listening to the sound being played. Therefore, in the present embodiment, adjusting the output of the equalizer in the audio device of the vehicle may mean adjusting the acoustic signal outputted through the speaker 3 according to the user's taste or the result of determining the type of noise.

In addition, as an optional embodiment, the output adjuster 143-3 may adjust the gain by applying the Lombard effect based on the volume and the waveform of the noise, thereby allowing the user to listen to the output acoustic signal of the speaker 3 at the volume set by the user regardless of the amount of background noise. In addition, the output adjuster 143-3 may apply the Lombard effect to adjust the pitch (frequency) of the output acoustic signal differently in a noisy environment, so that the user can hear an acoustic signal of a clear sound quality in any environment. In other words, the output adjuster 143-3 may adjust the equalizer setting based on the waveform of the noise.

In addition, the output adjuster 143-3 may be configured to store environmental noise for each driving situation and normal speech of a user, convert the normal speech according to the driving situation such that the Lombard effect is applied to the normal speech, and output speech to which the Lombard effect has been applied according to the driving noise corresponding to the externally-determined driving situation (hereinafter referred to as "simulated Lombard speech"). Here, the Lombard effect may refer to a speaker's tendency to alter his or her speech in the presence of background noise. Due to the Lombard effect, speech rate, speech intensity, and fundamental frequency of speech of a driver may increase in comparison to normal speech, thereby affecting the speech recognition rate. In other words, since normal speech, which is generated by recording the speaker's speech in a studio environment without any background noise, is different from Lombard speech uttered by the driver in a specific driving environment, simulated Lombard speech similar to Lombard speech can be used instead of normal speech in order to assess the accuracy of speech recognition.

In the present embodiment, when the first acoustic event signal is generated, the noise detector 143-2 may detect acoustic signals other than the spoken utterance of the user, among the acoustic signals in the vehicle, as noise. Here, the output adjuster 143-3 may adjust settings of the volume 132-1 and the equalizer 132-2 of the spoken response utterance signal corresponding to the spoken utterance of the user among the acoustic signals being outputted through the speaker 3 provided in the vehicle in response to the magnitude and the waveform of the noise. For example, in the present embodiment, when the user makes an utterance in order to receive a voice recognition service in a vehicle, the output adjuster 143-3 may regard an acoustic signal in the vehicle other than the spoken utterance of the user as noise and increase the volume 132-1 of the spoken response utterance of the voice recognition service outputted through the speaker 3 according to the amount of noise, and may adjust the equalizer 132-2 setting so that the user can clearly hear the spoken response utterance of the speech recognition service. In this case, the spoken utterance of the user may be detected using the second deep neural network model.

In addition, when a second acoustic event signal is generated, the noise detector 143-2 may detect the spoken utterance of the user, the spoken utterance of another passenger, or the sound of a pre-stored pattern among the acoustic signals, as noise. At this time, the output adjuster 143-3 may adjust settings of the volume 132-1 and the equalizer 132-2 of the acoustic signal being outputted through the speaker 3 provided in the vehicle in response to the magnitude and the waveform of the noise. For example, in the present embodiment, when a user is having a conversation with another passenger, the output adjuster 143-3 may regard the conversation speech as noise, decrease the volume 132-1 of the acoustic service (such as music or a navigation guidance voice) being outputted through the speaker 3 according to the amount of noise (conversation speech), and adjust the equalizer 132-2 setting for smooth conversation. In addition, for example, in the present embodiment, when the sound of a predetermined pattern (such as the sound of a baby crying or a horn sound generated for a certain time or more within a certain distance outside the vehicle) is collected through the microphone 2, the output adjuster may regard the sound of the predetermined pattern as noise and decrease the volume 132-1 of the acoustic service (such as music or a navigation guidance voice) being outputted through the speaker 3, according to the amount of noise (sound of the predetermined pattern). This is because, when a baby in the back seat is crying, the baby may cry louder if the volume of the speaker 3 is increased, and the user may not hear the baby crying. In addition, when a horn is ringing toward the user's vehicle from outside the vehicle, the horn may not be heard if the volume of the speaker 3 is too loud. That is, in the present embodiment, when such a special event occurs, it may be judged as normal noise even if it is not a spoken utterance or speech, and it may be determined that a second acoustic event signal has been generated. These special events may be applied as a result of learning, or may be entered at an initial stage.

When a third acoustic event signal is generated, the noise detector 143-2 may detect the spoken utterance of another passenger among the acoustic signals, as noise. Here, the output adjuster 143-3 may adjust settings of the volume 132-1 and the equalizer 132-2 of the acoustic service being outputted through the speaker 3 provided in the vehicle in response to the magnitude and the waveform of the noise. For example, in the present embodiment, when a passenger other than the user is speaking, the output adjuster 143-3 may detect the spoken utterance of the other passenger as noise and increase the volume 132-1 of the acoustic service (such as music or a navigation guidance voice) being outputted through the speaker 3 in response to the volume of the noise (the spoken utterance of the other passenger), and may adjust the setting of the equalizer 132-2 so that the user can clearly hear the acoustic service.

In addition, when the fourth acoustic event signal is generated, the noise detector 143-2 may detect acoustic signals other than the acoustic service, among the acoustic signals, as noise. Here, the output adjuster 143-3 may adjust settings of the volume 132-1 and the equalizer 132-2 of the acoustic service among the acoustic signals being outputted through the speaker 3 in response to the magnitude and the waveform of the noise. For example, in the present embodiment, when a user is not talking to another user in a vehicle but an acoustic service (such as music or a navigation guidance voice) is being outputted from the speaker 3, the output adjuster 143-3 may regard the acoustic signal other than the acoustic service as noise, increase the volume 132-1 of the acoustic signal being outputted through the speaker 3 according to the amount of noise (the acoustic signal other than the acoustic service), and adjust the equalizer 132-2 setting so that the user may clearly hear the acoustic service. In addition, in the present embodiment, when the user is not talking with another user but is talking on the phone using a hands-free function, the acoustic signal other than the speech of the counterpart of the call (including the speech of the user) may be regarded as noise, the volume 132-1 of the acoustic signal (the speech of the counterpart of the call) being outputted through the speaker may be increased according to the amount of noise (the acoustic signals other than the speech of the counterpart of the call), and the setting of the equalizer 132-2 may be adjusted so that the user may clearly hear the speech of the counterpart through the hands-free function.

Meanwhile, when the fifth acoustic event signal is generated, the noise detector 143-2 may adjust the volume 132-1 and equalizer 132-2 settings of the output acoustic signal being outputted through the speaker 3 in response to the volume and the waveform of an abnormal noise within a predetermined range on the basis of a user setting state in response to the fifth acoustic event signal. For example, in the present embodiment, when there is no conversation taking place in the vehicle but external environmental noise (abnormal noise) is currently being outputted in the vehicle, the output adjuster 143-3 may detect the magnitude and waveform of the abnormal noise, increase the volume 132-1 of the acoustic signal being outputted through the speaker 3 according to the magnitude and waveform of the noise (abnormal noise), and adjust the equalizer 132-2 setting so that the user can clearly hear the acoustic signal. However, in the present embodiment, the output adjuster 143-3 may only adjust the abnormal noise within a predetermined range, based on the user setting state for the volume and the equalizer. This is because, in the case of short-term noise such as abnormal noise, if the adjustment of the volume and equalizer settings is large, the user may feel awkward and the hearing may not be clear, and thus the range of the volume and equalizer setting adjustment may be set to be small.

Meanwhile, in the present embodiment, the acoustic control system 1 may analyze and learn a pattern frequently generated or a pattern frequently used by the user with respect to generation of the first to fifth acoustic event signals. In this case, the acoustic control system 1 may apply a weight to a frequently occurring or frequently used pattern. The acoustic control system 1 may, for example, recommend a navigation destination of navigation for the user, adjust the output of the equalizer according to the genre of music that the user frequently listens to, or adjust the output of the volume and the equalizer in response to a sound that the user frequently hears. In this way, the type of the noise may be more accurately determined, and user-customized settings for the output of the volume and the equalizer may be provided.

Meanwhile, in the present embodiment, when the first acoustic event signal is generated, the speech recognition service may be activated in response to the first acoustic event signal. In the present embodiment, the in-vehicle speech recognition service may ordinarily be in an inactive state, and may be activated without a separate wakeup word when the first acoustic event signal is generated. That is, the speech recognition service may be deactivated when the second acoustic event signal, the third acoustic event signal, and the fourth acoustic event signal are generated. The speech recognition service is deactivated in order to prevent voice command misrecognition when a spoken utterance is made by a person other than the user. However, if there is a setting for separate speech recognition, or if the spoken utterance of the user can be clearly analyzed, the speech recognition service can be provided even in the case of a spoken utterance made by a person other than the user. According to the present embodiment, the performance of speech recognition may be improved by accurately analyzing the acoustic signal in the vehicle and adjusting the magnitude of the input/output acoustic signal for voice recognition in response to the analysis result of the acoustic signal in the vehicle. That is, in the present embodiment, the volume of the spoken utterance of the user collected for speech recognition according to the magnitude and waveform of the noise, and the magnitude and frequency of the spoken response utterance signal in response to the speech recognition result, may be adjusted. This will be described below with respect to the speech recognition process.

In the present embodiment, the speech recognizer 145 may include an automatic speech recognizer (ASR) 145-1, a natural language understanding unit 145-2, and a natural language generator 145-3 and a text to speech (TTS) converter 145-4.

The ASR 145-1 may generate a voice actor utterance text obtained by converting a voice actor (user) spoken utterance to text. In the present embodiment, the ASR 145-1 may perform speech-to-text (STT) conversion. The ASR 145-1 may convert the voice actor spoken utterance inputted from the audio input interface 131 into a voice actor utterance text. In the present embodiment, the ASR 145-1 may include an utterance recognizer (not shown). The utterance recognizer may include an acoustic model and a language model. For example, the acoustic model may include vocalization-related information, and the language model may include unit phoneme information and information about combination of the unit phoneme information. The utterance recognizer may use the vocalization-related information and the unit phoneme information to convert a voice actor spoken utterance to a voice actor utterance text. Information about the acoustic model and language model may be stored, for example, in an automatic speech recognition database (not shown) in the ASR 145-1.

The natural language understanding unit 145-2 may perform syntactic analysis or semantic analysis on the voice actor utterance text to analyze an utterance intention of the voice actor spoken utterance, that is, the intention of the spoken utterance of the user. Here, the syntactic analysis may divide the query text into syntactic units (for example, words, phrases, and morphemes) and may recognize what grammatical elements the divided units have. In addition, the semantic analysis can be performed using semantic matching, rule matching, formula matching, and the like. Accordingly, the natural language understanding unit 145-2 may obtain parameters required for learning the intent behind a voice actor utterance text or parameters required for expressing such an intent.

The natural language generator 145-3 may generate a response text corresponding to the voice actor utterance text by using a knowledge base based on the utterance intention analyzed by the natural language understanding unit 145-2.

The text-to-speech converter 145-4 may generate a spoken response utterance obtained as a result of converting the response text to a spoken response utterance in the form of natural language speech, generated by the natural language generator 145-3, and may output the spoken response utterance through the audio output interface 132.

That is, the speech recognizer 145 may output a voice actor spoken utterance corresponding to the spoken utterance of the user, in speech of a voice actor having the highest degree of similarity with the speech of the user, by using a user-voice actor mapping learning model. In this case, the speech recognizer 145 may include a generator (not shown), and may thereby generate the user-voice actor mapping learning model. The generator may generate feature information of the spoken utterance of the user by analyzing the received spoken utterance of the user. The feature information of the spoken utterance of the user may include at least one of a tone, dialect, gender, speed, or age of the spoken utterance of the user. Further, the generator may generate feature information of the spoken utterance of the user, including a tone thereof, by analyzing word endings and word stems in the spoken utterance of the user and/or the received user utterance text. Further, the generator may generate feature information of the spoken utterance of the user, including a dialect thereof, by analyzing word endings, word stems, and pitch of the spoken utterance of the user and/or the received user utterance text. The generator may generate feature information of the spoken utterance of the user, including the gender and pitch thereof, by analyzing the pitch of the spoken utterance of the user. Further, the generator may generate feature information of the spoken utterance of the user, including the utterance speed thereof, by analyzing a word count and a unit time associated with the spoken utterance of the user and/or the user utterance text. The generator may generate feature information of the spoken utterance of the user, including the age associated therewith, by analyzing the spectrum of the spoken utterance of the user.

In the present embodiment, the user-voice actor mapping learning model is generated by the generator, and upon completion of the generation of the feature information of the received spoken utterance of the user, the user-voice actor mapping learning model may be executed. In an optional embodiment, the user-voice actor mapping learning model may be stored in a database 144 or a memory 150 in advance. Once the generator completes the generation of the feature information of the spoken utterance of the user, the speech recognizer 145 may load the user-voice actor mapping learning model from the database 144 or the memory 150 and execute the model. Furthermore, the user-voice actor mapping learning model may be stored in the server (300 of FIG. 2), and once the generator completes the generation of the feature information of the spoken utterance of the user, the acoustic control system 1 may request the server to execute the user-voice actor mapping learning model and receive the user-voice actor mapping learning model execution result from the server.

The generator may determine a voice actor's speech having the highest degree of similarity with the spoken utterance of the user by comparing the feature information of the spoken utterance of the user with the feature information of a plurality of voice actors' speech stored in advance in the database 144. Here, the generator may determine the voice actor's speech having the highest degree of similarity to the spoken utterance of the user through comparison between feature information including at least one of a tone, dialect, gender, pitch, speed, or age of the spoken utterance of the user, and feature information including at least one of tone, dialect, gender, pitch, speed, and age of the plurality of voice actors' speech included in the database 144.

In an optional embodiment, when determining the voice actor's speech having the highest degree of similarity with the spoken utterance of the user, the generator may extract a feature vector of the spoken utterance of the user and compare the feature vector of the spoken utterance of the user with the feature vectors of the plurality of voice actors' speech stored in the database 144, and based on the result of the comparison, the feature vector of the voice actor's speech having the highest degree of similarity with the feature vector of the spoken utterance of the user may be determined. The generator may receive a user utterance text obtained by converting the spoken utterance of the user to text, and generate a voice actor spoken utterance by synthesizing the received user utterance text with the voice actor's speech having the highest degree of similarity with the spoken utterance of the user. The generator may use the text-to-speech converter 145-4 included in the speech recognizer 145 to generate the voice actor uttered speech. The generator may train a deep neural network model by using the feature information of the spoken utterance of the user and the feature information of the voice actor spoken utterance as a training data set. Here, the feature information of the voice actor's spoken utterance may be received through the generator or may be pre-stored in the database 144. The generator may generate a user-voice actor mapping learning model which outputs, through training the deep neural network, the spoken utterance of the user as a voice actor's spoken utterance having the highest degree of similarity with the spoken utterance of the user, and may store the generated learning model in the database or memory 150.

Meanwhile, in the present embodiment, a detector 146 for detecting driving of the vehicle may be included. Here, the adjuster 143 may adjust settings of the volume 132-1 and the equalizer 132-2 of the acoustic signal being outputted through the speaker 3 provided in the vehicle in response to the driving mode of the vehicle. For example, the adjuster 143 may adjust the volume 132-1 and equalizer 132-2 settings so that the acoustic signal being outputted through the speaker 3 becomes a preset value when the vehicle is in the high speed driving mode. This is based on the fact that the noise generated in the high speed driving mode is relatively consistent, and the noise generation varies according to the driving mode of the vehicle.

Figure 13:
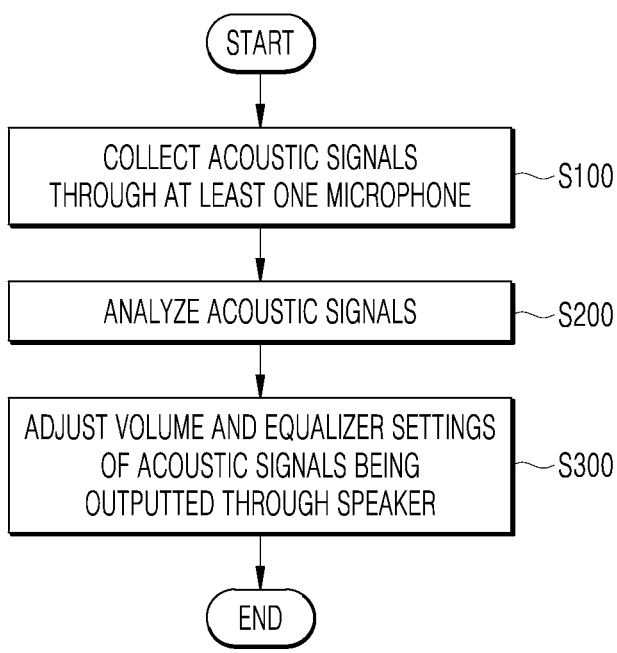
FIG. 13 is a flowchart illustrating an acoustic control method according to an embodiment of the present disclosure.

FIG. 13 is a flowchart illustrating an acoustic control method according to an embodiment of the present disclosure. In the following description, description of parts that are the same as those in FIG. 1 to FIG. 12 will be omitted.

Referring to FIG. 13, in step S100, the sound control system 1 collects acoustic signals in a vehicle through one or more microphones provided in a travelling vehicle. That is, the sound control system 1 may collect, for example, a sound outputted from a speaker, a sound generated inside the vehicle, a sound generated outside the vehicle, and a spoken utterance of a user through the microphone. Meanwhile, in the present embodiment, the acoustic control system 1 may use various echo cancellation algorithms for removing echoes generated in the process of collecting acoustic signals in the vehicle generated in the travelling vehicle. Also, the acoustic control system 1 may use various echo cancellation algorithms for canceling echoes generated in the process of receiving the spoken utterance of the user.

In step S200, the acoustic control system 1 analyzes the acoustic signal in the vehicle. That is, the acoustic control system 1 may analyze the feature of the acoustic signal in the vehicle so as to determine whether the acoustic signal in the vehicle is normal noise or abnormal noise. In addition, in the present embodiment, by analyzing the characteristics of the acoustic signal and using the first deep neural network model that has been trained to determine whether the acoustic signal is normal noise or abnormal noise generated in the vehicle, it may be determined whether the noise in the vehicle is abnormal or abnormal. In this case, the first deep neural network model may be trained through training data in which big data on sounds normally generated in a vehicle is labeled as normal noise. In the present embodiment, the acoustic control system 1 may classify and recognize acoustic events including normal noise and abnormal noise that may be generated in a vehicle in a hierarchical manner. That is, the acoustic control system 1 may evaluate acoustic features by calculating a similarity between the acoustic feature of the acoustic signal and a reference acoustic feature. The reference acoustic feature is a feature previously obtained by training with respect to a defined plurality of acoustic events. In addition, the acoustic control system 1 may extract a feature of the inputted acoustic signal, and compare the feature with a pre-trained acoustic model so as to determine the type of the acoustic signal (normal noise or abnormal noise). In this embodiment, the acoustic control system 1 may perform noise verification using a statistical model method based on GMM. That is, the acoustic control system 1 may first classify an acoustic signal into a speech signal and a non-speech signal. Thereafter, when the acoustic signal is a speech signal, the acoustic signal may be classified as an event of normal noise, and when the acoustic signal is a non-speech signal, the acoustic signal may be classified as an event of abnormal noise. Herein, when the sound is a non-speech sound, the sound of a pre-stored pattern may be classified as normal noise.

In step S300, the acoustic control system 1 adjusts the volume of the output acoustic signal being outputted through the speaker provided in the vehicle and the setting of the equalizer in response to the analysis result of the acoustic signal in the vehicle. That is, the acoustic control system 1 may adjust the volume of the acoustic signal being outputted through the speaker 3 provided in the vehicle and the setting of the equalizer in response to the type of the acoustic signal in the vehicle. In other words, the acoustic control system 1 may generate an event signal corresponding to the type of the acoustic signal, detect the noise in response to the generated event signal, and adjust the volume and the output of the equalizer in response to the magnitude and waveform of the noise based on the detected noise. Hereinafter, a method of adjusting the volume of the acoustic signal being outputted through the speaker and the equalizer setting according to the type of the acoustic signal will be described in more detail with reference to FIG. 14.

Figure 14:
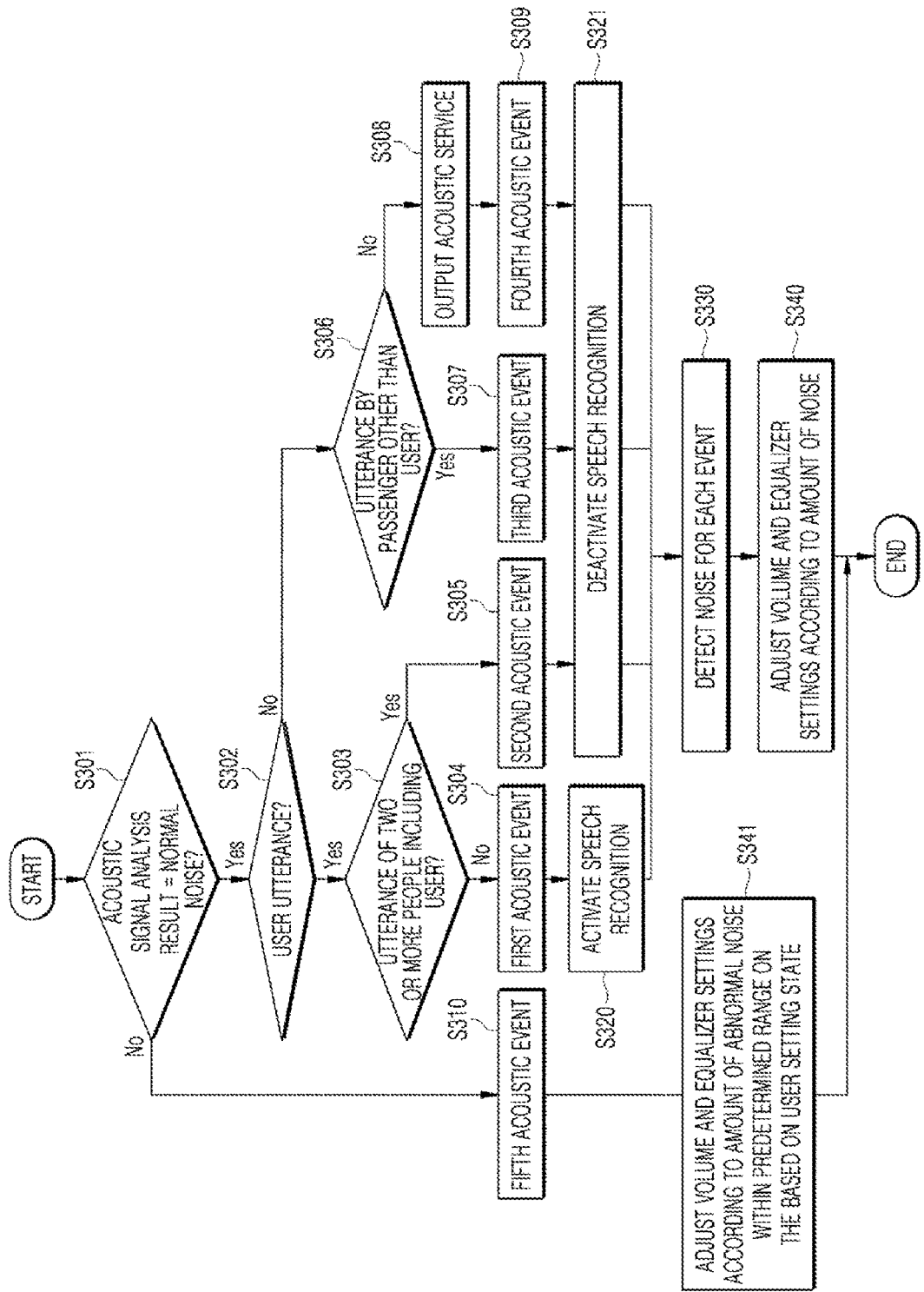
FIG. 14 is a flowchart illustrating a method of adjusting an acoustic control system according to an embodiment of the present disclosure.

FIG. 14 is a flowchart illustrating a method of adjusting an acoustic control system according to an embodiment of the present disclosure.

Referring to FIG. 14, in step S301, the acoustic control system 1 analyzes an acoustic signal in a vehicle and checks whether it is normal noise based on the analysis result.

In step S302, the acoustic control system 1 checks whether the normal noise is a spoken utterance of a user (YES in step S301). That is, as a result of analyzing the acoustic signal in the vehicle, the acoustic control system 1 may determine whether the acoustic signal in the vehicle is normal noise including the spoken utterance of the user. In this embodiment, the spoken utterance of the user may be determined using a second deep neural network model. In the present embodiment, prior to the step of collecting the in-vehicle acoustic signal through the one or more microphones provided in the vehicle, the spoken utterance of the user of the vehicle may be registered through the microphone, and a deep neural network model for voice discrimination may be trained with the spoken utterance of the user to thereby generate the second deep neural network model capable of discriminating the spoken utterance of the user.

In step S303, the acoustic control system 1 checks whether there are spoken utterances of two or more people including the user (YES in step S302). That is, as a result of analyzing the acoustic signal in the vehicle, the acoustic control system 1 may determine whether the acoustic signal in the vehicle is normal noise including the spoken utterance of the user and the spoken utterance of another passenger.

In step S304, as a result of analyzing the acoustic signal in the vehicle, when only the spoken utterance of the user is detected, the acoustic control system 1 generates a first acoustic event signal (NO in step S303). That is, in the present embodiment, as a result of analyzing the acoustic signal in the vehicle, when the acoustic signal is normal noise including the spoken utterance of the user, the first acoustic event signal may be generated.

In step S320, when the first acoustic event signal is generated (step S304), the acoustic control system 1 activates a speech recognition service. That is, in the present embodiment, when a spoken utterance of the user is inputted, the speech recognition service can be activated without a separate wakeup word. However, the present disclosure is not limited thereto, and may be changed by a separate setting. The acoustic control system 1 may activate the speech recognition service only when the spoken utterance of an already-registered user, that is, a driver, is included in the collected acoustic signal.

In step S330, when the first acoustic event signal is generated (step S304), the acoustic control system 1 detects acoustic signals other than the spoken utterance of the user among the acoustic signals, as noise.

In step S340, the acoustic control system 1 adjusts the volume of the spoken response utterance signal corresponding to the speech recognition service result among the acoustic signals being outputted through the speaker provided in the vehicle and the setting of the equalizer in response to the magnitude and waveform of the noise detected in step S330. For example, in the present embodiment, when the user makes an utterance in order to receive a voice recognition service in a vehicle, the acoustic control system 1 may regard an acoustic signal other than the spoken utterance of the user as noise and increase the volume of the spoken response utterance of the voice recognition service according to the amount of noise, and may adjust the equalizer setting so that the user can clearly hear the spoken response utterance of the speech recognition service.

Meanwhile, in step S305, as a result of analyzing the acoustic signal in the vehicle, when the acoustic signal includes the spoken utterance of the user and includes spoken utterances of two or more people including the user, the acoustic control system 1 generates a second acoustic event signal (YES in step S303). That is, as a result of analyzing the acoustic signal in the vehicle, when the acoustic signal is normal noise including the spoken utterance of the user and a spoken utterance of another passenger, the acoustic control system 1 may generate a second acoustic event signal. Meanwhile, in the present embodiment, as a result of analyzing the acoustic signal in the vehicle, the second acoustic event signal may be generated even when the acoustic signal is normal noise including the sound of a previously stored pattern.

In step S321, when the second acoustic event signal is generated (step S305), the acoustic control system 1 may activate the speech recognition service. However, in the present embodiment, the speech recognition service may ordinarily be in an inactive state, and in the inactive state, a current state may be maintained.

In step S330, when the second acoustic event signal is generated (step S305), the acoustic control system 1 detects a spoken utterance of the user and a spoken utterance of another passenger, or a sound of a previously pattern, as noise.

In step S340, the acoustic control system 1 adjusts the volume of the output acoustic signal being outputted through the speaker provided in the vehicle and the setting of the equalizer in response to the magnitude and waveform of the noise detected in step S330. For example, in the present embodiment, when a user is having a conversation with another user, the acoustic control system 1 may regard the conversation speech as noise, decrease the volume of the acoustic service (such as music or a navigation guidance voice) being outputted through the speaker according to the amount of noise (conversation speech), and adjust the equalizer setting for smooth conversation. Also, for example, in the present embodiment, when the sound of a predetermined pattern (such as the sound of a baby crying or a horn sound generated for a certain time or more within a certain distance outside the vehicle) is collected through the microphone, the acoustic control system 1 regards the sound of the predetermined pattern as noise and decreases the volume of the acoustic signal (such as music or a navigation guidance voice) being outputted through the speaker, according to the amount of noise (sound of predetermined pattern). This is because, when a baby in the back seat is crying, the baby may cry louder if the volume of the speaker 3 is increased, and the user may not hear the baby crying. In addition, when a horn is ringing toward the user's vehicle from outside the vehicle, the horn may not be heard if the volume of the speaker is too loud. That is, in the present embodiment, when such a special event occurs, it may be judged as normal noise even if it is not a spoken utterance or speech, and it may be determined that a second acoustic event signal has been generated.

Meanwhile, in step S306, as a result of analyzing the acoustic signal in the vehicle, when the acoustic signal is normal noise and does not include a spoken utterance of the user, the acoustic control system 1 checks whether the acoustic signal includes the spoken utterance of another passenger other than the user (NO in step S302). That is, as a result of analyzing the acoustic signal in the vehicle, the acoustic control system 1 may determine whether the acoustic signal in the vehicle is normal noise including a spoken utterance of another passenger other than the user.

In step S307, as a result of analyzing the acoustic signal in the vehicle, when the acoustic signal is normal noise including the spoken utterance of another passenger other than the user, the acoustic control system 1 generates a third acoustic event (example of step S306).

In step S321, when the third acoustic event signal is generated (step S307), the acoustic control system 1 may activate a speech recognition service.

In step S330, when the third acoustic event signal is generated (step S307), the acoustic control system 1 detects the spoken utterance of the other passenger, among the acoustic signals, as noise.

In step S340, the acoustic control system 1 adjusts the volume of the acoustic signal being outputted through the speaker provided in the vehicle and the setting of the equalizer in response to the magnitude and waveform of the noise detected in step S330. For example, in the present embodiment, when another passenger other than the user is speaking, the acoustic control system may detect the spoken utterance of the other passenger as noise and increase the volume of the acoustic service (such as music or a navigation guidance voice) being outputted through the speaker in response to the volume of the noise (the spoken utterance of the other user) and may adjust the setting of the equalizer so that the user can clearly hear the acoustic signal. That is, in the present embodiment, when another passenger is talking on the phone or talking with one or more other passengers, it is determined as noise, and the volume of the acoustic signal that the user is listening to may be increased. However, in the present embodiment, when there is only a spoken utterance of another passenger, the volume and equalizer settings may be adjusted according to noise by the user's setting. For example, if the user is not speaking and another passenger is talking to the user, the setting may be changed to detect the acoustic service as noise so that the other passenger's voice may be clearly heard.

Meanwhile, in step S308, the acoustic control system 1 checks whether the acoustic service is currently being outputted (NO in step S306). Here, the acoustic service may include music being outputted from the speaker and a navigation guidance voice, and in the present embodiment, the acoustic service may include a speech of the other party in a hands-free call.

In step S309, in the case of normal noise including an acoustic service being outputted through a speaker in a travelling vehicle, the acoustic control system 1 may generate a fourth acoustic event signal.

In step S321, when the fourth acoustic event signal is generated (step S309), the acoustic control system 1 may activate a speech recognition service.

In step S330, when the fourth acoustic event signal is generated (step S309), the acoustic control system 1 detects acoustic signals other than the acoustic service among the acoustic signals, as noise.

In step S340, the acoustic control system 1 adjusts the volume of the acoustic service among the acoustic signals being outputted through the speaker and the setting of the equalizer in response to the magnitude and waveform of the noise detected in step S330. For example, in the present embodiment, when a user is not talking to another user in a vehicle but an acoustic service (such as music or a navigation guidance voice) is being outputted from a speaker, the acoustic control system 1 may regard the acoustic signal other than the acoustic service as noise, increase the volume of the acoustic service being outputted through the speaker according to the amount of noise (the acoustic signal other than the acoustic service), and adjust the equalizer setting so that the user may clearly hear the acoustic service. In addition, in the present embodiment, when the user is not talking with another user but is talking on the phone using a hands-free function, the acoustic control system 1 may regard the acoustic signal other than the speech of the counterpart of the call (including speech of the user) as noise, increase the volume of the acoustic signal (the speech of the counterpart of the call) being outputted through the speaker according to the amount of noise (the acoustic signals other than the speech of the counterpart of the call), and adjust the setting of the equalizer so that the user may clearly hear the speech of the counterpart through the hands-free function.

In step S310, as a result of analyzing the acoustic signal, when the acoustic signal is abnormal noise including external environmental noise generated in the travelling vehicle, the acoustic control system 1 generates a fifth acoustic event signal (NO in step S301).

In step S341, when the fifth acoustic event signal is generated (step S310), the acoustic control system 1 adjusts the volume and equalizer settings of the output acoustic signal being outputted through the speaker in response to the abnormal noise level within a certain range on the basis of the user setting state in response to the fifth acoustic signal. For example, in the present embodiment, when there is no conversation taking place in the vehicle but external environmental noise (abnormal noise) is currently being outputted in the vehicle, the acoustic control system 1 may detect the magnitude and waveform of the abnormal noise, increase the volume 132-1 of the acoustic signal being outputted through the speaker 3 according to the magnitude and waveform of the noise (abnormal noise), and adjust the equalizer setting so that the user can clearly hear the acoustic signal. However, in the present embodiment, the acoustic control system 1 may only adjust the abnormal noise within a predetermined range based on the user setting state for the volume and the equalizer. This is because, in the case of short-term noise such as abnormal noise, if the adjustment of the volume and equalizer settings is large, the user may feel awkward and the hearing may not be clear, and thus the range of the volume and equalizer adjustment may be set to be small.

The embodiments of the present disclosure described above may be implemented through computer programs executable through various components on a computer, and such computer programs may be recorded in computer-readable media. For example, the recording media may include magnetic media such as hard disks, floppy disks, and magnetic media such as a magnetic tape, optical media such as CD-ROMs and DVDs, magneto-optical media such as floptical disks, and hardware devices specifically configured to store and execute program commands, such as ROM, RAM, and flash memory.

Meanwhile, the computer programs may be those specially designed and constructed for the purposes of the present disclosure or they may be of the kind well known and available to those skilled in the computer software arts. Examples of program code include both machine codes, such as produced by a compiler, and higher level code that may be executed by the computer using an interpreter.

As used in the present application (especially in the appended claims), the terms "a/an" and "the" include both singular and plural references, unless the context clearly conditions otherwise. Also, it should be understood that any numerical range recited herein is intended to include all sub-ranges subsumed therein (unless expressly indicated otherwise) and accordingly, the disclosed numeral ranges include every individual value between the minimum and maximum values of the numeral ranges.

Operations constituting the method of the present disclosure may be performed in appropriate order unless explicitly described in terms of order or described to the contrary. The present disclosure is not necessarily limited to the order of operations given in the description. All examples described herein or the terms indicative thereof ("for example," etc.) used herein are merely to describe the present disclosure in greater detail. Therefore, it should be understood that the scope of the present disclosure is not limited to the example embodiments described above or by the use of such terms unless limited by the appended claims. Therefore, it should be understood that the scope of the present disclosure is not limited to the example embodiments described above or by the use of such terms unless limited by the appended claims. Also, it should be apparent to those skilled in the art that various alterations, substitutions, and modifications may be made within the scope of the appended claims or equivalents thereof.

Therefore, technical ideas of the present disclosure are not limited to the above-mentioned embodiments, and it is intended that not only the appended claims, but also all changes equivalent to claims, should be considered to fall within the scope of the present disclosure.

What is claimed is:

1. An acoustic control method for adjusting a sound, the acoustic control method comprising:
    collecting one or more acoustic signals in a vehicle through at least one microphone provided in the vehicle;
    analyzing the acoustic signals in the vehicle; and
    adjusting volume and equalizer settings of an acoustic service being outputted through a speaker provided in the vehicle in response to the analyzed acoustic signals in the vehicle, wherein the analyzing of the acoustic signals in the vehicle comprises determining whether the acoustic signals in the vehicle are normal noise or abnormal noise using a first deep neural network model that has been trained in advance to determine whether the acoustic signals are normal noise or abnormal noise generated in the vehicle by analyzing features of the acoustic signals, and wherein the first deep neural network model is trained through training data in which big data on sounds normally generated in a vehicle are labeled as normal noise.

2. The acoustic control method of claim 1, further comprising, prior to the collecting of the acoustic signals in the vehicle through at least one microphone provided in the vehicle:

registering a spoken utterance of a user of the vehicle through the microphone; and training a deep neural network for speech discrimination with the spoken utterance of the user to thereby generate a second deep neural network model capable of discriminating the spoken utterance of the user.

3. The acoustic control method of claim 2, wherein the adjusting comprises:

as a result of analyzing the acoustic signals in the vehicle by using the first and second deep neural network models, when the acoustic signals in the vehicle are normal noise including the spoken utterance of the user, generating a first acoustic event signal;

activating a speech recognition service in response to the first acoustic event signal;

detecting acoustic signals other than the spoken utterance of the user among the acoustic signals in the vehicle; and adjusting volume and equalizer settings of at least one spoken response utterance signal corresponding to the spoken utterance of the user in response to a magnitude and waveform of the noise.

4. The acoustic control method of claim 2, wherein the adjusting comprises:

as a result of analyzing the acoustic signals in the vehicle by using the first and second deep neural network models, when the acoustic signals in the vehicle are normal noise including the spoken utterance of the user and a spoken utterance of another passenger, generating a second acoustic event;

deactivating a speech recognition service in response to the second acoustic event signal;

detecting sounds of the spoken utterance of the user and the spoken utterance of the other passenger among the acoustic signals, as noise; and adjusting volume and equalizer settings of the acoustic service in response to the magnitude and waveform of the noise.

5. The acoustic control method of claim 2, wherein the adjusting comprises:

as a result of analyzing the acoustic signals in the vehicle by using the first and second deep neural network models, when the acoustic signals in the vehicle are normal noise including the spoken utterance of another passenger other than the user, generating a third acoustic event signal;

deactivating a speech recognition service in response to the third acoustic event signal;

detecting the spoken utterance of the other passenger among the acoustic signals, as noise; and adjusting volume and equalizer settings of the acoustic service in response to the magnitude and waveform of the noise.

6. The acoustic control method of claim 2, wherein the adjusting comprises:

as a result of analyzing the acoustic signals in the vehicle by using the first deep neural network model, when the acoustic signals in the vehicle are normal noise including the acoustic service, generating a fourth acoustic event signal;

deactivating a speech recognition service in response to the fourth acoustic event signal;

detecting acoustic signals other than the acoustic service, among the acoustic signals in the vehicle, as noise; and adjusting volume and equalizer settings of the acoustic service in response to the magnitude and waveform of the noise.

7. The acoustic control method of claim 2, wherein the adjusting comprises:

as a result of analyzing the acoustic signals in the vehicle by using the first deep neural network model, when the acoustic signals in the vehicle are abnormal noise including external environmental noise generated in the vehicle, generating a fifth acoustic event signal; and in response to the fifth acoustic event, adjusting volume and equalizer settings of the acoustic service in response to the magnitude and waveform of the abnormal noise within a predetermined range on the basis of a user setting state.

8. The acoustic control method of claim 1, further comprising detecting a driving mode of the vehicle, and wherein the adjusting further comprises adjusting volume and equalizer settings of the acoustic service in response to the driving mode of the vehicle.

9. An acoustic control apparatus configured to adjust a sound, the acoustic control apparatus comprising:

a collector configured to collect one or more acoustic signals in a vehicle through at least one microphone provided in the vehicle;

a determiner configured to analyze the acoustic signals in the vehicle; and an adjuster configured to adjust volume and equalizer settings of an acoustic service being outputted through a speaker provided in the vehicle in response to the analyzed acoustic signals in the vehicle, wherein the determiner is configured to determine whether the acoustic signals in the vehicle are normal noise or abnormal noise using a first deep neural network model that has been trained in advance to determine whether the acoustic signals are normal noise or abnormal noise generated in the vehicle by analyzing features of the acoustic signals, and wherein the first deep neural network model is trained through training data in which big data on sounds normally generated in a vehicle are labeled as normal noise.

10. The acoustic control apparatus of claim 9, wherein the acoustic control apparatus is configured to, prior to collecting one or more acoustic signals in the vehicle through the microphone provided in the vehicle, register a spoken utterance of a user of the vehicle through the microphone and train a deep neural network for speech discrimination with the spoken utterance of the user to thereby generate a second deep neural network model capable of discriminating the spoken utterance of the user.

11. The acoustic control apparatus of claim 9, wherein the adjuster is configured to:

as a result of analyzing the acoustic signals in the vehicle by using the first and second deep neural network models, when the acoustic signals in the vehicle are normal noise including the spoken utterance of the user, generate a first acoustic event signal;

activate a speech recognition service in response to the first acoustic event signal;

detect acoustic signals other than the spoken utterance of the user among the acoustic signals in the vehicle; and adjust volume and equalizer settings of at least one spoken response utterance signal corresponding to the spoken utterance of the user in response to a magnitude and waveform of the noise.

12. The acoustic control apparatus of claim 10, wherein the adjuster is configured to:

as a result of analyzing the acoustic signals in the vehicle by using the first and second deep neural network models, when the acoustic signals in the vehicle are normal noise including the spoken utterance of the user and a spoken utterance of another passenger, generate a second acoustic event signal;

deactivate a speech recognition service in response to the second acoustic event signal;

detect sounds of the spoken utterance of the user and the spoken utterance of the other passenger among the acoustic signals, as noise; and adjust volume and equalizer settings of the acoustic service in response to the magnitude and waveform of the noise.

13. The acoustic control apparatus of claim 10, wherein the adjuster is configured to:

as a result of analyzing the acoustic signals in the vehicle by using the first and second deep neural network models, when the acoustic signals in the vehicle are normal noise including the spoken utterance of another passenger other than the user, generate a third acoustic event signal;

deactivate a speech recognition service in response to the third acoustic event signal;

detect the spoken utterance of the other passenger among the acoustic signals, as noise; and adjust volume and equalizer settings of the acoustic service in response to the magnitude and waveform of the noise.

14. The acoustic control apparatus of claim 10, wherein the adjuster is configured to:

as a result of analyzing the acoustic signals in the vehicle by using the first deep neural network model, when the acoustic signals in the vehicle are normal noise including the acoustic service, generate a fourth acoustic event signal;

deactivate a speech recognition service in response to the fourth acoustic event signal;

detect acoustic signals other than the acoustic service, among the acoustic signals in the vehicle, as noise; and adjust volume and equalizer settings of the acoustic service in response to the magnitude and waveform of the noise.

15. The acoustic control apparatus of claim 10, wherein the adjuster is configured to:

as a result of analyzing the acoustic signals in the vehicle by using the first deep neural network model, when the acoustic signals in the vehicle are abnormal noise including external environmental noise generated in the vehicle, generate a fifth acoustic event signal; and in response to the fifth acoustic event, adjust volume and equalizer settings of the acoustic service in response to a magnitude and waveform of the abnormal noise within a predetermined range on the basis of a user setting state.

16. An acoustic control system for adjusting a sound, the acoustic control system comprising:

at least one microphone configured to collect acoustic signals in a vehicle, generated in the vehicle;

a speaker configured to output an acoustic service in the vehicle; and a sound processor configured to analyze acoustic signals in the vehicle, collected from the microphone, and adjust volume and equalizer settings of the acoustic service in response to a result of analyzing the acoustic signals in the vehicle, wherein the sound processor is configured to determine whether the acoustic signals in the vehicle are normal noise or abnormal noise using a first deep neural network model that has been trained in advance to determine whether the acoustic signals are normal noise or abnormal noise generated in the vehicle by analyzing features of the acoustic signals, and wherein the first deep neural network model is trained through training data in which big data on sounds normally generated in a vehicle are labeled as normal noise.

* * * * *